(12) United States Patent
Kamijima et al.

(10) Patent No.: US 7,026,677 B2
(45) Date of Patent: Apr. 11, 2006

(54) MAGNETORESISTIVE ELEMENT, MAGNETIC MEMORY CELL, AND MAGNETIC MEMORY DEVICE, AND METHOD FOR MANUFACTURING THE SAME

(75) Inventors: Akifumi Kamijima, Chuo-ku (JP); Hitoshi Hatate, Chuo-ku (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/893,981

(22) Filed: Jul. 20, 2004

(65) Prior Publication Data

US 2005/0018476 A1    Jan. 27, 2005

(30) Foreign Application Priority Data

Jul. 23, 2003    (JP)    ............... 2003-200412

(51) Int. Cl.
*H01L 29/76*    (2006.01)
(52) U.S. Cl. ............... 257/295; 257/421; 257/E21.665; 257/E27.006; 257/E29.164; 257/E43.001; 257/E21.663; 257/E21.208; 438/3; 438/240; 438/785
(58) Field of Classification Search ............... None
See application file for complete search history.

(56) References Cited

U.S. PATENT DOCUMENTS

| | | | |
|---|---|---|---|
| 4,954,920 A * | 9/1990 | Yamada et al. | ............. 360/315 |
| 5,343,422 A | 8/1994 | Kung et al. | |
| 5,629,922 A | 5/1997 | Moodera et al. | |
| 6,134,078 A * | 10/2000 | Suzuki | ............. 360/315 |
| 6,510,078 B1 * | 1/2003 | Schwarzl | ............. 365/158 |
| 6,548,849 B1 * | 4/2003 | Pan et al. | ............. 257/296 |
| 6,879,515 B1 * | 4/2005 | Yoda et al. | ............. 365/158 |
| 2001/0050859 A1 | 12/2001 | Schwarzl | |
| 2004/0021189 A1 * | 2/2004 | Yoda et al. | ............. 257/421 |

FOREIGN PATENT DOCUMENTS

| | | |
|---|---|---|
| EP | 0 875 901 A2 | 11/1998 |
| EP | 1 246 191 A2 | 10/2002 |
| JP | A 9-91949 | 4/1997 |
| JP | A 2001-273759 | 10/2001 |
| JP | 2002353415 A * | 12/2002 |
| JP | A 2002-353415 | 12/2002 |

\* cited by examiner

*Primary Examiner*—Andy Huynh
(74) *Attorney, Agent, or Firm*—Oliff & Berridge, PLC

(57) ABSTRACT

The present invention provides a magnetic memory device capable of performing stable operation efficiently using a magnetic field generated by write current and formed with high precision while realizing a compact configuration. Since a plating film is used for at least a part of a magnetic yoke, as compared with the case of formation by a dry film forming method, sufficient thickness and higher dimensional precision can be obtained. Consequently, a more stabilized return magnetic field can be generated and high reliability can be assured. Neighboring memory cells can be disposed at narrower intervals, so that the invention is suitable for realizing higher integration and higher packing density.

7 Claims, 25 Drawing Sheets

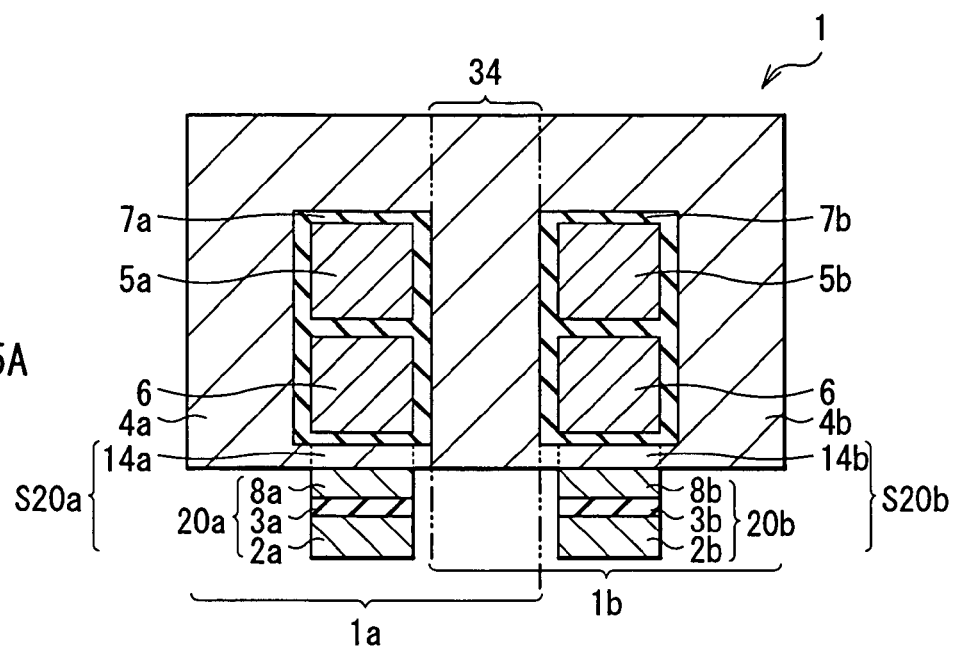
FIG. 5A
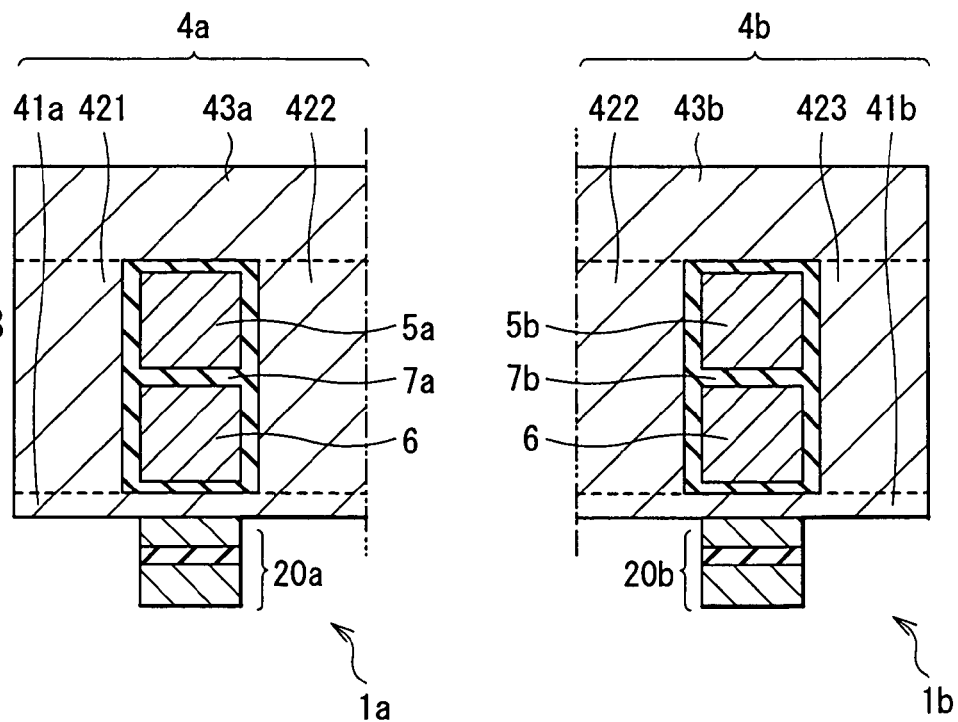
FIG. 5B
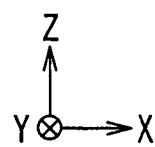

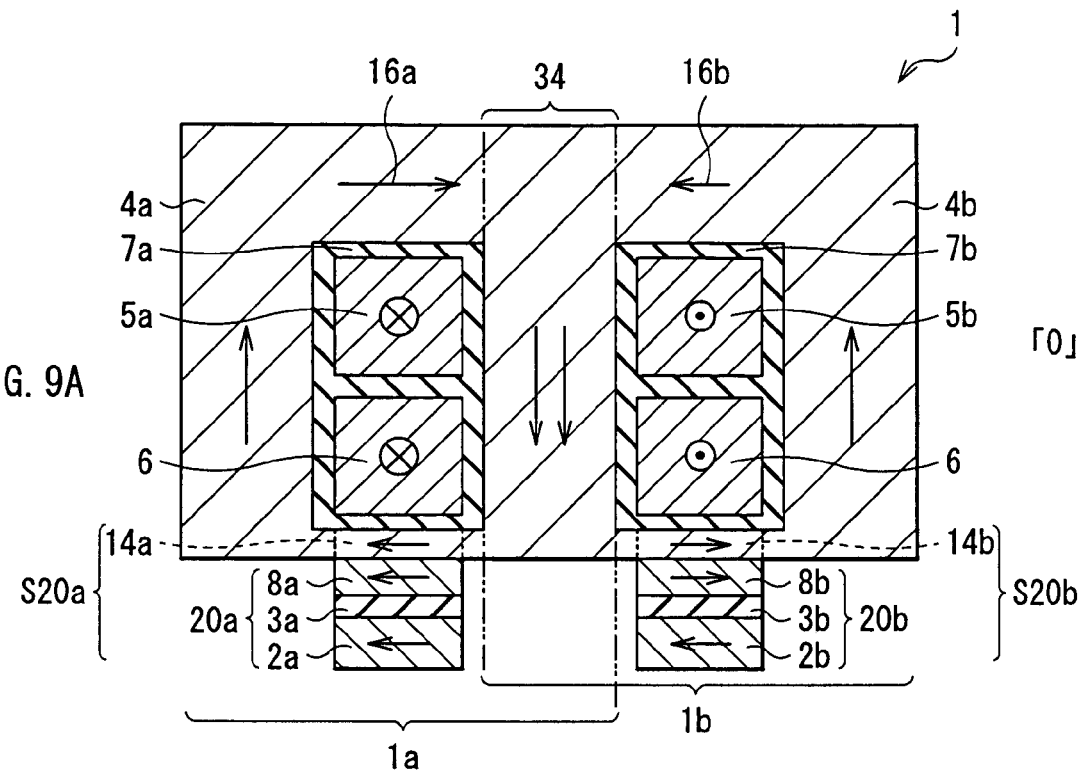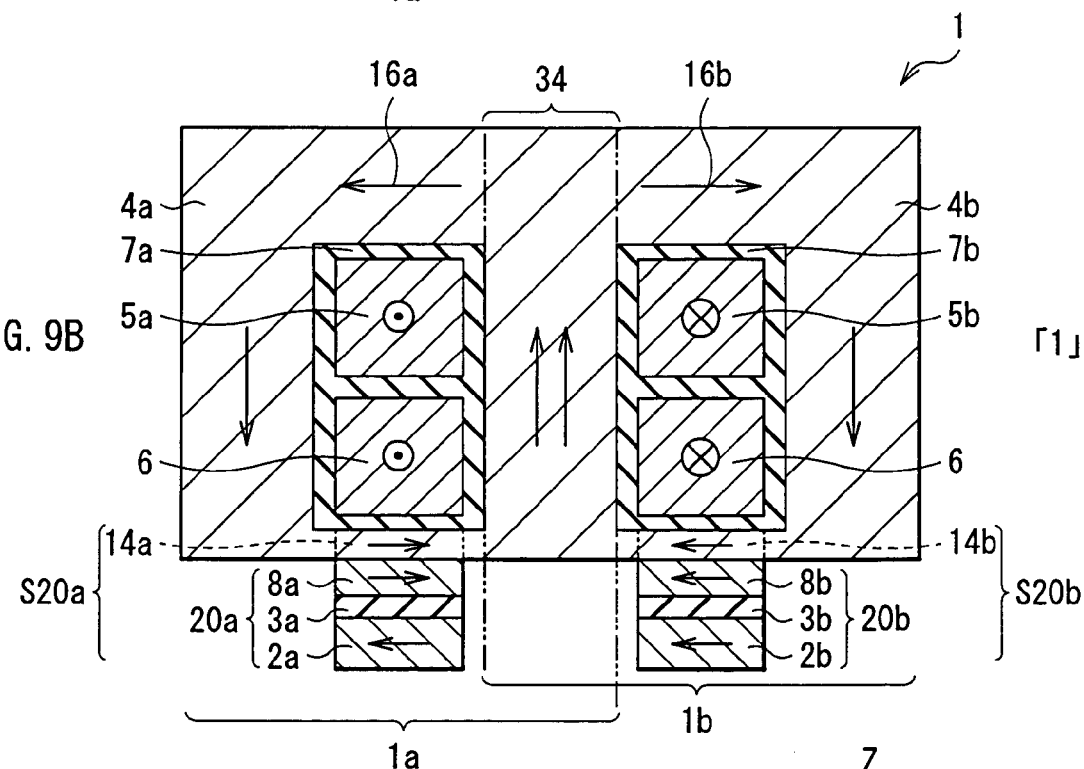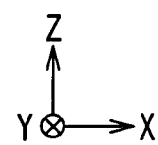

「0」

「1」

MAGNETORESISTIVE ELEMENT, MAGNETIC MEMORY CELL, AND MAGNETIC MEMORY DEVICE, AND METHOD FOR MANUFACTURING THE SAME

BACKGROUND OF THE INVENTION

1. Field of the Invention

The present invention relates to a magnetoresistive element and a magnetic memory cell each including a magneto-sensitive layer of which magnetization direction changes according to an external magnetic field and a method of manufacturing the same. The invention also relates to a magnetic memory device for recording/reading information by using a change in the magnetization direction of a magneto-sensitive layer in the magnetoresistive element and the magnetic memory cell and to a method of manufacturing the same.

2. Description of the Related Art

Conventionally, as general memories used for an information processor such as a computer or a communication device, volatile memories such as a DRAM (Dynamic Random Access Memory) and an SRAM (Static RAM) are used. The volatile memories have to be refreshed by always supplying current to hold stored information. When the power source is turned off, all of information is lost, so that a nonvolatile memory as means for recording information has to be provided in addition to the volatile memory. For example, a flash EEPROM, a magnetic hard disk drive, or the like is used.

In the nonvolatile memories, as the speed of information processing increases, increase in speed of an access is becoming an important subject. Further, as a portable information device is being rapidly spread and the performance is becoming higher, information device development aiming at so-called ubiquitous computing which means that information processing can be performed everywhere at any time is rapidly being progressed. Development of a nonvolatile memory adapted for higher-speed processing as a key device of such information device development is in strong demand.

As a technique effective to increase the speed of the nonvolatile memory, a magnetic random access memory (hereinbelow, described as MRAM) is known in which magnetic memory elements each for storing information in accordance with the magnetization direction along the axis of easy magnetization of a ferromagnetic layer are arranged in a matrix. The MRAM stores information by using a combination of the magnetization directions in two ferromagnetic members. On the other hand, stored information is read by detecting a resistance change (that is, a change in current or voltage) which occurs between the case where the magnetization direction is parallel with a reference direction and the case where the magnetization direction is not parallel with the reference direction. Since the MRAM operates with the principle, it is important that the resistance change ratio is as high as possible to perform stable writing and reading in the MRAM.

The MRAM currently used in practical utilizes the giant magneto-resistive (GMR) effect. The GMR effect is a phenomenon such that when two magnetic layers are disposed so that their axes of easy magnetization are parallel with each other, in the case where the magnetization directions of the layers are in parallel along the axis of easy magnetization, the resistance value becomes the minimum. In the case where the magnetization directions are not parallel with each other, the resistance value becomes the maximum. An MRAM using a GMR element capable of obtaining such a GMR effect (hereinbelow, described as GMR-MRAM) is disclosed in, for example, U.S. Pat. No. 5,343,422.

Recently, aiming at further improvement in storing speed, access speed, and the like, an MRAM which has a TMR element using tunneling magneto-resistive effect (TMR) in place of the GMR-MRAM is proposed (hereinbelow, described as TMR-MRAM). The TMR effect is an effect such that the tunnel current passing through an insulating layer changes in accordance with relative angles of the magnetization directions in two ferromagnetic layers sandwiching a very-thin insulating layer (tunnel barrier layer). When the magnetization directions in the two ferromagnetic layers are parallel with each other, the resistance value becomes the minimum. On the contrary, when the magnetization directions are not parallel with each other, the resistance value becomes the maximum. In the TMR-MRAM, when the TMR element has a configuration of, for example, "CoFe/aluminum oxide/CoFe", the resistance change ratio is as high as 40% and the resistance value is also large. Consequently, the TMR-MRAM can be easily matched with a semiconductor device such as an MOSFET. Therefore, the TMR-MRAM can easily obtain a higher output as compared with the GMR-MRAM, and improvement in storage capacity and access speed is expected. In the TMR-MRAM, a current magnetic field is generated by passing current to a conductor as a write line disposed near the TMR element. By using the current magnetic field, and the magnetization direction in the magnetic layer of the TMR element is changed to a predetermined direction, thereby storing information. As a method of reading stored information, a method of passing current in the direction perpendicular to a tunnel barrier layer and detecting a resistance change in the TMR element is known. Such TMR-MRAM techniques are disclosed in U.S. Pat. No. 5,629,922 and Japanese Patent Laid-open No. Hei 9-91949. Recently, higher packing density of a magnetic memory device is in increasing demand and, accordingly, reduction in the size of the TMR element is also required. As the TMR element is becoming finer, due to the influence of a demagnetizing field generated by magnetic poles at both ends of the TMR element, the magnetization direction in a magnetic layer (free magnetization direction layer) for storing information becomes unstable and it becomes difficult to hold recorded information. To solve the problem, a structure in which a closed magnetic circuit is formed in addition to the free magnetization direction layer around a conductor (write line) near the TMR element is proposed (refer to, for example, Japanese Patent Laid-open No. 2001-273759). According to Japanese Patent Laid-open No. 2001-273759, since the free magnetization direction layer related to recording is a component of the closed magnetic circuit, the adverse influence by the demagnetizing field can be avoided and a magnetic memory device of high packing density can be realized. Further, in this case, both of two write lines extend in the closed magnetic circuit, so that magnetization can be efficiently inverted.

Japanese Patent Laid-open No. 2001-273759, however, does not disclose a concrete method of manufacturing the TMR-MRAM having the structure in which the closed magnetic circuit is formed. In particular, a closed magnetic circuit layer which forms the closed magnetic circuit in cooperation with the free magnetization direction layer of the TMR element has to have high dimensional precision and sufficient thickness in the direction orthogonal to the substrate face in order to achieve smaller size and higher packing density. It is expected that high mass productivity is also important for future wide spread use in future. In such circumstances, establishment of a manufacturing method capable of realizing high dimensional precision and sufficient thickness is urgently necessary.

SUMMARY OF THE INVENTION

The present invention has been achieved in consideration of such problems and its first object is to provide a magneto-resistive element, a magnetic memory cell, and a magnetic memory device including the magneto-resistive element and the magnetic memory cell, each having a compact configuration, to which information can be stably written by efficiently using a magnetic field generated by current flowing in a conductor, and which is formed with high precision. A second object is to provide a method of manufacturing the magneto-resistive element, a magnetic memory cell, and a magnetic memory device.

A magneto-resistive element according to the invention comprises: a magnetic yoke disposed in correspondence with a partial region along an extension direction of a conductor and constructed so as to surround partially or entirely the periphery of the conductor; and a stacked body including a magneto-sensitive layer of which magnetization direction changes according to an external magnetic field, magnetically coupled to the magnetic yoke, and constructed so that current flows in a direction perpendicular to a stacked face. At least a part of the magnetic yoke is constructed by a plating film.

A method of manufacturing a magneto-resistive element according to the invention comprises: a step of forming a magnetic yoke so as to be disposed in correspondence with a partial region along an extension direction of a conductor and so as to surround partially or entirely the periphery of the conductor; and a step of forming a stacked body including a magneto-sensitive layer of which magnetization direction changes according to an external magnetic field, magnetically coupled to the magnetic yoke, and constructed so that current flows in a direction perpendicular to a stacked face. In the step of forming the magnetic yoke, at least a part of the magnetic yoke is formed by plating.

A magnetic memory cell according to the invention comprises a pair of magneto-resistive elements each including: a magnetic yoke disposed in correspondence with a partial region along an extension direction of a conductor and constructed so as to surround partially or entirely the periphery of the conductor; and a stacked body including a magneto-sensitive layer of which magnetization direction changes according to an external magnetic field, magnetically coupled to the magnetic yoke, and constructed so that current flows in a direction perpendicular to a stacked face. The pair of magneto-resistive elements share a part of the magnetic yoke, and at least a part of the magnetic yoke is constructed by a plating film.

A method of manufacturing a magnetic memory cell according to the invention, the magnetic memory cell comprising a pair of magneto-resistive elements each including a magnetic yoke and a stacked body, comprises: a step of forming a pair of the magnetic yokes disposed in correspondence with a partial region along an extension direction of a conductor, constructed so as to surround partially or entirely the periphery of the conductor, and partially sharing each other; and a step of forming a pair of the stacked bodies each including a magneto-sensitive layer of which magnetization direction changes according to an external magnetic field, magnetically coupled to the pair of magnetic yokes, and constructed so that current flows in a direction perpendicular to a stacked face. In the step of forming the pair of magnetic yokes, at least a part of the pair of magnetic yokes is formed by plating.

A magnetic memory device according to a first aspect of the invention comprises: a first write line; a second write line extending so as to cross the first write line; and a magneto-resistive element. The magneto-resistive element includes: a magnetic yoke disposed in correspondence with a region in which the first and second write lines cross each other and constructed so as to surround partially or entirely the periphery of the first and second write lines; and a stacked body including a magneto-sensitive layer of which magnetization direction changes according to an external magnetic field, magnetically coupled to the magnetic yoke, and constructed so that current flows in a direction perpendicular to a stacked face. At least a part of the magnetic yoke is constructed by a plating film.

A magnetic memory device according to a second aspect of the invention comprises: a first write line; a second write line extending so as to cross the first write line; and a pair of magneto-resistive elements. Each of the pair of magneto-resistive elements includes: a magnetic yoke disposed in correspondence with a region in which the first and second write lines cross each other and constructed so as to surround partially or entirely the periphery of the first and second write lines; and a stacked body including a magneto-sensitive layer of which magnetization direction changes according to an external magnetic field, magnetically coupled to the magnetic yoke, and constructed so that current flows in a direction perpendicular to a stacked face. The pair of magneto-resistive elements share a part of the magnetic yoke, and at least a part of the magnetic yoke is constructed by a plating film.

A method of manufacturing a magnetic memory device according to a second aspect of the invention, the magnetic memory device comprising: a first write line; a second write line extending so as to cross the first write line; and a pair of magneto-resistive elements each including a magnetic yoke and a stacked body, comprises: a step of forming a pair of the magnetic yokes disposed in correspondence with a region in which the first and second write lines cross each other, surrounding partially or entirely the periphery of the first and second write lines, and partially sharing each other; and a step of forming a pair of the stacked bodies including a magneto-sensitive layer of which magnetization direction changes according to an external magnetic field, magnetically coupled to the pair of magnetic yokes, and constructed so that current flows in a direction perpendicular to a stacked face. In the step of forming the pair of magnetic yokes, at least a part of the pair of magnetic yokes is formed by plating.

In the magnetoresistive element, magnetic memory cell, and magnetic memory devices according to the first and second aspect of the invention, at least a part of the magnetic yoke is formed by a plating film. Consequently, as compared with the case of formation by a dry film forming method, relatively large thickness and higher dimensional precision can be obtained.

In the method of manufacturing the magnetoresistive element and the method of manufacturing the magnetic memory cell according to the invention, and the method of manufacturing the magnetic memory device according to the second aspect of the invention, at least a part of the magnetic yoke is formed by a plating film. Consequently, as compared with the case of formation by a dry film forming method, relatively larger thickness and higher dimensional precision can be obtained.

In the magnetoresistive element according to the invention and the magnetic memory device according to the first aspect of the invention, the magnetic yoke may include: a pair of pillar yokes extending in a growth direction of the plating film while facing each other; and a beam yoke connecting with each one end of the pair of pillar yokes, and may have a sectional shape a part of which is open. Alternately, the magnetic yoke may include: a pair of pillar yokes extending in a growth direction of the plating film while facing each other; and a pair of beam yokes connecting with both ends of the pair of pillar yokes, and may have a closed sectional shape. The conductor (the first and second write lines) may be also made by a plating film.

In the magnetic memory cell according to the invention and the magnetic memory device according to the second aspect of the invention, the magnetic yoke may include: a pair of pillar yokes extending in a growth direction of the plating film while facing each other; and a beam yoke connecting with each one end of the pair of pillar yokes, and may have a sectional shape a part of which is open. Further, the pair of magneto-resistive elements may share at least one of the pair of pillar yokes. Alternately, the magnetic yoke may include a pair of beam yokes connecting with both ends of the pair of pillar yokes and may have a closed sectional shape. The pair of magneto-resistive elements may share at least one of the pair of pillar yokes. The conductor (first and second write lines) may be also made by a plating film. "The sectional shape a part of which is open" denotes a shape having an open end in a section orthogonal to the extending direction of the conductor.

Other and further objects, features and advantages of the invention will appear more fully from the following description.

BRIEF DESCRIPTION OF THE DRAWINGS

FIGS. 5A and 5B are cross sections showing the configuration of a plane taken along line V—V of the memory cell illustrated in FIG. 3.

FIGS. 9A and 9B are diagrams showing the relation between a write current direction and a return magnetic field direction (magnetization direction) in the sectional configuration of the memory cell illustrated in FIGS. 5A and 5B.

DETAILED DESCRIPTION OF THE PREFERRED EMBODIMENTS

Embodiments of the invention will now be described in detail hereinbelow with reference to the drawings.

First, with reference to FIGS. 1 to 7, the configuration of a magnetic memory device according to an embodiment of the invention will be described.

Figure 1:
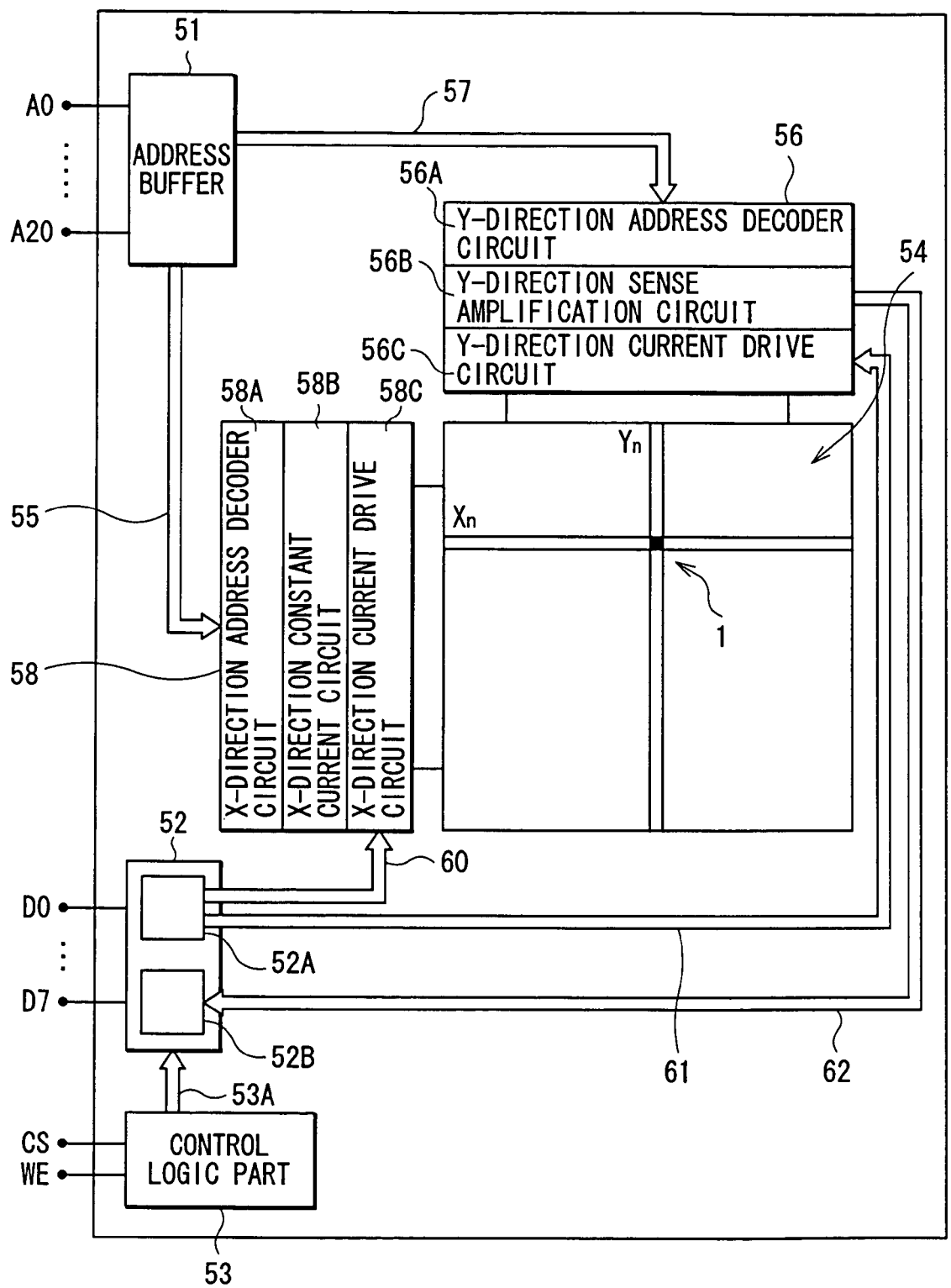
FIG. 1 is a block diagram showing a general configuration of a magnetic memory device according to an embodiment of the invention.

FIG. 1 is a conceptual diagram showing a general configuration of a magnetic memory device in the embodiment. The magnetic memory device has an address buffer 51, a data buffer 52, a control logic part 53, a memory cell group 54, a first drive control circuit part 56, a second drive control circuit part 58, external address input terminals A0 to A20, and external data terminals D0 to D7.

The memory cell group 54 has a matrix structure in which a number of memory cells 1 each having a pair of tunneling magneto-resistive elements (hereinbelow, called TMR elements) are arranged in a word line direction (X direction) and a bit line direction (Y direction) which are orthogonal to each other. The memory cell 1 is the minimum unit for storing data in the magnetic memory device and is a concrete example corresponding to a "magnetic memory cell" in the invention. The memory cell 1 will be described in detail later.

The first drive control circuit part 56 has an address decoder circuit 56A, a sense amplification circuit 56B, and a current drive circuit 56C in the Y direction. The second drive control circuit part 58 has an address decoder circuit 58A, a constant current circuit 58B, and a current drive circuit 58C in the X direction.

The address decoder circuits 56A and 58A are to select a word decode line 72 (which will be described later) and a bit decode line 71 (which will be described later) according to an input address signal. The sense amplification circuit 56B and the constant current circuit 58B are circuits driven at the time of performing reading operation. The current drive circuits 56C and 58C are circuits driven at the time of performing writing operation.

The sense amplification circuit 56B and the memory cell group 54 are connected to each other via a plurality of bit decode lines 71 in which the sense current flows at the time of reading operation. Similarly, the constant current circuit 58B and the memory cell group 54 are connected to each other via a plurality of word decode lines 72 in which the sense current flows at the time of reading operation.

The Y-direction current drive circuit 56C and the memory cell group 54 are connected to each other via write bit lines 5 (which will be described later) necessary at the time of writing operation. Similarly, the X-direction current drive circuit 58C and the memory cell group 54 are connected to each other via write word lines 6 (which will be described later) necessary at the time of writing operation.

The address buffer 51 has the external address input terminals A0 to A20 and is connected to the Y-direction address decoder circuit 56A in the first drive control circuit part 56 and the X-direction address decoder circuit 58A in the second drive control circuit part 58 via a Y-direction address line 57 and an X-direction address line 55. The address buffer 51 receives an address signal from the outside via the external address input terminals A0 to A20 and amplifies the address signal to a voltage level required in the Y-direction address decoder circuit 56A and the X-direction address decoder circuit 58B by a buffer amplifier (not shown) provided in the address buffer 51. Further, the address buffer 51 functions to divide the amplified address signal into two signals and output the signals to the Y-direction address decoder circuit 56A via the Y-direction address line 57 and the X-direction address decoder circuit 58A via the X-direction address line 55.

The data buffer 52 is constructed by an input buffer 52A and an output buffer 52B, has the external data terminals D0 to D7, is connected to the control logic part 53, and operates by an output control signal 53A from the control logic part 53. The input buffer 52A is connected to the Y-direction current drive circuit 56C in the first drive control circuit part 56 and the X-direction current drive circuit 58C in the second drive control circuit part 58 via a Y-direction write data bus 61 and an X-direction write data bus 60, respectively. At the time of performing an operation of writing data to the memory cell group 54, the input buffer 52A functions to receive signal voltages of the external data terminals D0 to D7, amplify the signal voltage to a required voltage level by an internal buffer amplifier (not shown), and transmit the resultant voltage to the X-direction current drive circuit 58C and the Y-direction current drive circuit 56C via the X-direction write data bus 60 and the Y-direction write data bus 61, respectively. The output buffer 52B is connected to the sense amplification circuit 56B via a Y-direction read data bus 62. At the time of reading an information signal stored in the memory cell group 54, the output buffer 52B functions to amplify the information signal supplied from the sense amplification circuit 56B and to output the resultant signal with a low impedance to the external data terminals D0 to D7.

The control logic part 53 has a chip select terminal CS and a write enable terminal WE and is connected to the data buffer 52. The control logic part 53 functions to receive a signal voltage from the chip select terminal CS for selecting a memory cell to be read/written from the group 54 of plural memory cells and a signal voltage from the write enable terminal WE for outputting a write permit signal and to output the output control signal 53A to the data buffer 52.

The configuration related to information writing operation in the magnetic memory device of the embodiment will now be described.

Figure 2:
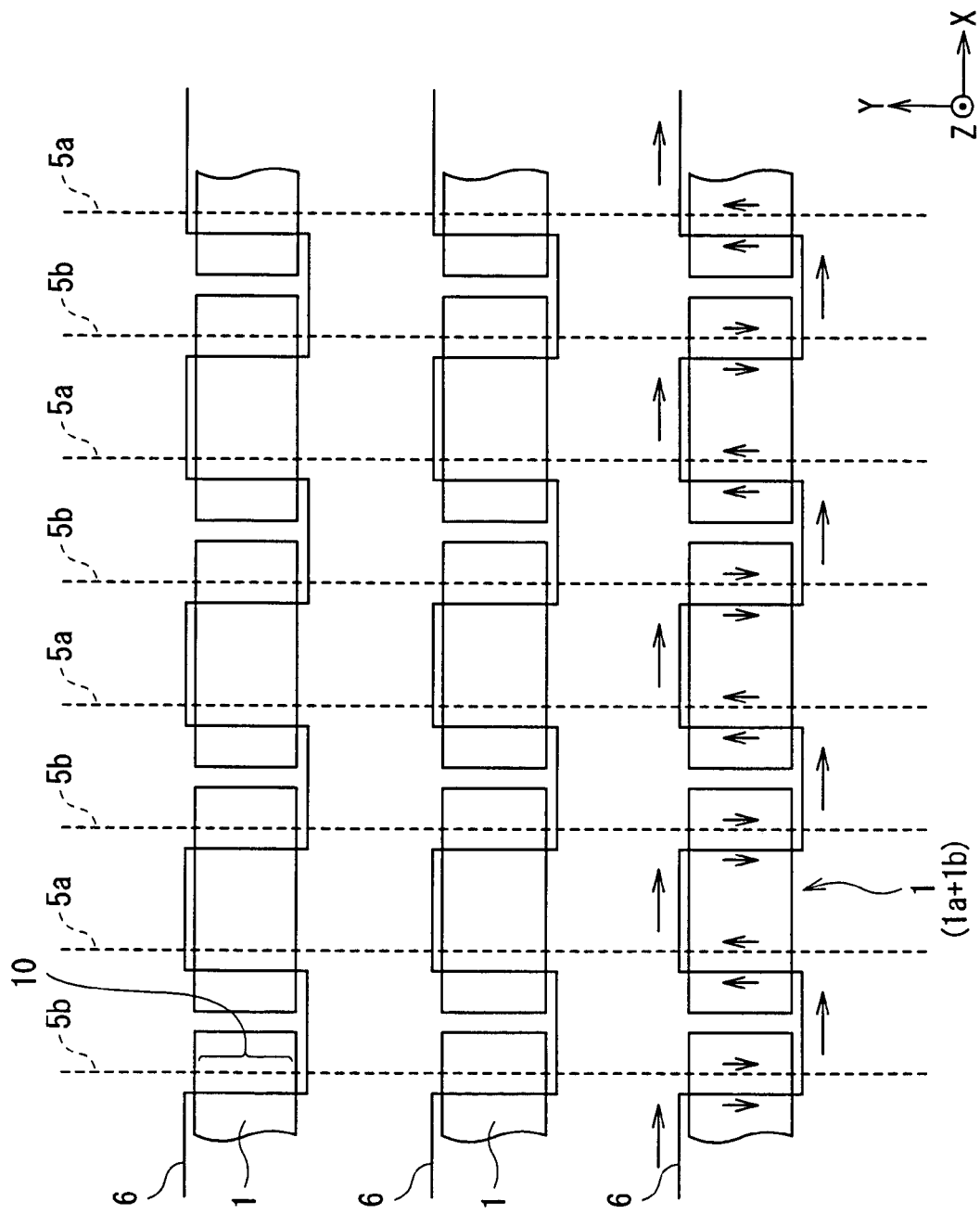
FIG. 2 is a plan view showing the configuration of a write line of the magnetic memory device illustrated in FIG. 1.

FIG. 2 is a conceptual diagram showing a configuration in plan view of a main part related to the writing operation in the memory cell group 54. As shown in FIG. 2, the magnetic memory device of the embodiment includes a plurality of write bit lines 5a and 5b and the plurality of write word lines 6 extending so as to cross the plurality of write bit lines 5a and 5b. Each region in which the write bit lines 5a and 5b and the write word line 6 cross each other includes a parallel part 10 in which the write bit lines 5a and 5b and the write word line 6 extend parallel with each other. Concretely, as shown in FIG. 2, the write word lines 6 extend in the X direction in a rectangular wave shape and the write bit lines 5a and 5b extend in the Y direction alternately and linearly. The rising and falling portions of the rectangular wave shape of the write word lines 6 form the plurality of parallel parts 10 in cooperation with the write bit lines 5a and 5b. The memory cell 1 is provided in the region where the write bit lines 5a and 5b cross the write word line 6 so as to include at least a part of the parallel part 10. The configuration that the memory cell 1 is provided in the crossing region includes a case where the memory cell 1 is provided next to the intersecting point. The memory cell 1 is constructed by TMR elements 1a and 1b, the TMR element 1a is provided in a region where the write bit line 5a and the write word line 6 cross each other, and the other TMR element 1b is provided in the region where the write bit line 5b and the write word line 6 cross each other. The TMR elements 1a and 1b are a concrete example of "a pair of magneto-resistive elements" of the invention.

To the write bit lines 5a and 5b and the write word line 6, currents from the Y-direction current drive circuit 56C and the X-direction current drive circuit 58C flow. The currents flowing in the write bit lines 5a and the currents flowing in the write bit lines 5b are always in the opposite directions. For example, as shown by the arrows in FIG. 2, when the current directions in the write bit lines 5a are set as +Y direction, the current directions in the write bit lines 5b are −Y direction. Therefore, in this case, when the current directions in the write word lines 6 are set as +X direction as a whole (from left to right in the drawing sheet), the current directions of the write bit lines 5a and those of the write word lines 6 in the TMR elements 1a are parallel with each other. The current directions of the write bit lines 5b and those of the write word lines 6 flowing in the other TMR elements 1b are also parallel with each other. In the following, if it is unnecessary to discriminate the current directions from each other, the write bit lines 5a and 5b will be simply referred to as the write bit line 5. The write word line 6 is a concrete example corresponding to a "first write line" in the invention, and the write bit line 5 is a concrete example corresponding to a "second write line" of the invention.

Figure 3:
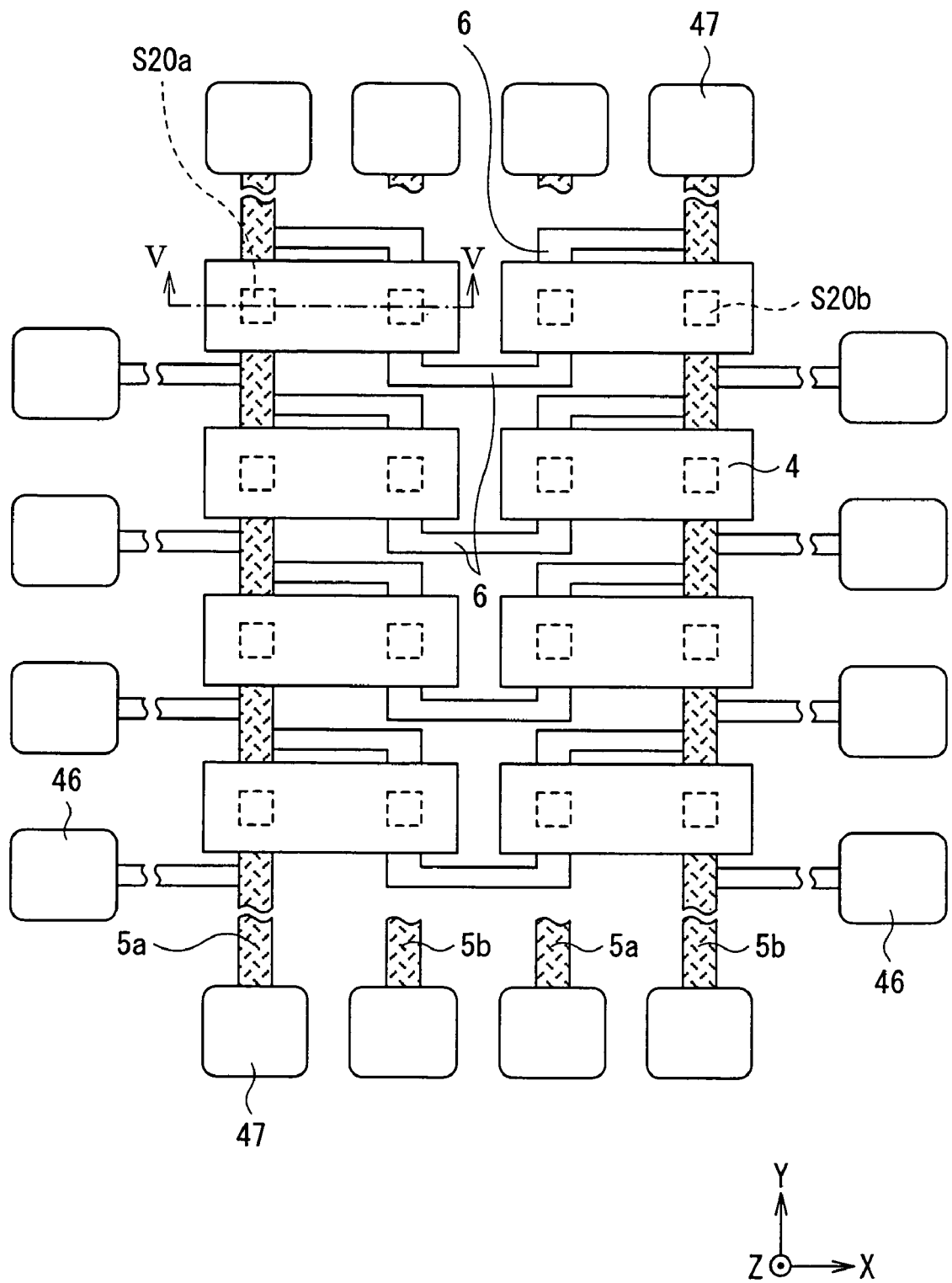
FIG. 3 is a partial plan view showing the configuration of a main part of a memory cell group in the magnetic memory device illustrated in FIG. 1.

FIG. 3 shows the configuration in plan view of the main part of the memory cell group 54 more specifically. The write bit lines 5a and 5b, write word lines 6, and memory cells 1 (TMR elements 1a and 1b) shown in FIG. 3 correspond to those in FIG. 2. The TMR elements 1a and 1b are disposed in the parallel parts 10 of the write bit lines 5a and 5b and the write word lines 6 in the Y direction. The TMR elements 1a and 1b have stacked bodies S20a and S20b each including a magneto-sensitive layer and the magnetic yokes 4a and 4b, respectively, and the magnetization direction of the magneto-sensitive layer changes according to the magnetic field generated by the currents flowing in the write bit line 5 and the write word line 6 in the parallel part 10 (that is, the external magnetic field in the magnetic yokes 4a and 4b). In this case, the write bit line 5 and the write word line 6 in the parallel part 10 are provided in almost matched positions in the XY plane. In the Z direction, they are disposed with a predetermined interval and are electrically insulated from each other.

At both ends of the write bit line 5, write bit line lead electrodes 47 are provided. One of the write bit line lead electrodes 47 is connected to the Y-direction current drive circuit 56C and the other one is connected so as to be finally grounded. Similarly, write word line lead electrodes 46 are provided at both ends of each write word line 6. One of the write word line lead electrodes 46 is connected to the X-direction current drive circuit 58C and the other one is connected so as to be finally grounded. In FIG. 3, the write bit lines 5 are partially omitted so that the shape of the write word lines 6 can be seen well.

Figure 4:
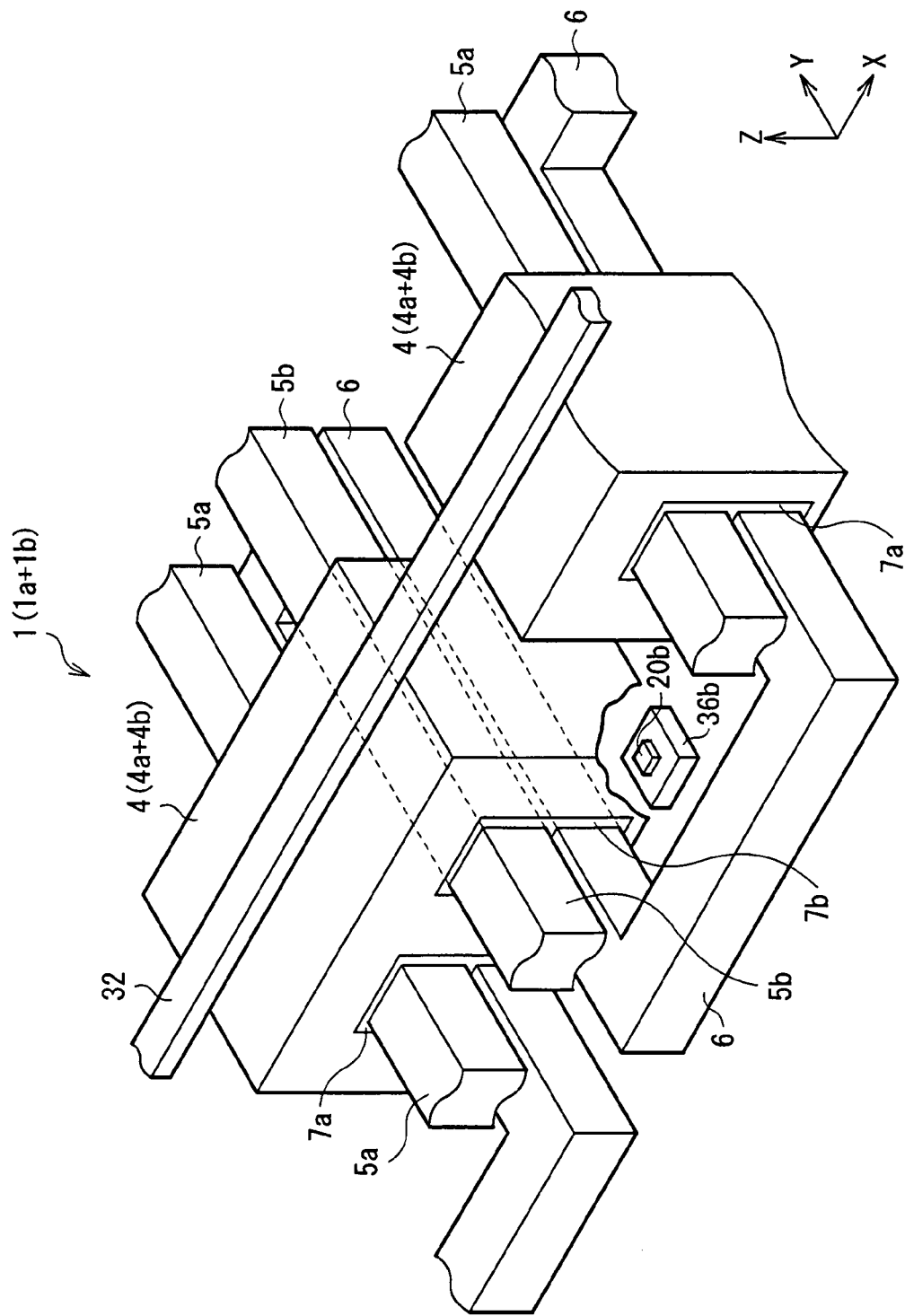
FIG. 4 is a perspective view showing the configuration of a main part of the memory cell group in the magnetic memory device illustrated in FIG. 1.

FIG. 4 is an enlarged perspective view of the memory cell 1. As shown in FIG. 4, the write word line 6 and write bit lines 5a and 5b and magnetic yokes 4a and 4b are electrically insulated from each other via insulating films 7a and 7b. A stacked part 20b as a part of the stacked body S20b is formed on the surface of the magnetic yoke 4b on the side opposite to the write bit line 5b over the write word line 6. A read word line 32 is provided so as to extend in the X direction on the side opposite to the side where the stacked part 20b is formed in the magnetic yoke 4b. Although not shown in FIG. 4, a stacked part 20a as a part of the stacked body S20a corresponding to the write bit line 5a and the write word line 6 is formed on the surface of the magnetic yoke 4a a part of which is commonly used by the magnetic yoke 4b. The pair of stacked bodies S20a and S20b are connected to conductive layers 36a and 36b formed on the side opposite to the magnetic yokes 4a and 4b (only the conductive layer 36b is shown). The pair of conductive layers 36a and 36b is a part of a pair of Schottky diodes 75a and 75b (which will be described later) and the other ends of the Schottky diodes 75a and 75b are connected to the read bit lines 33a and 33b (not shown) extending in the Y direction.

FIG. 5A shows a sectional configuration taken along line V—V of the memory cell 1 illustrated in FIG. 3. FIG. 5B shows the memory cell 1 of FIG. 5A which is conceptually divided into the TMR element 1a and the TMR element 1b.

As shown in FIGS. 5A and 5B, the TMR element 1a in the memory cell 1 has: the magnetic yoke 4a disposed in correspondence with the area where the write bit line 5a and the write word line 6 cross each other and is constructed so as to surround the whole periphery of the write bit line 5a and the write word line 6; and the stacked body S20a including the magneto-sensitive layer of which magnetization direction changes according to an external magnetic field, magnetically coupled to the magnetic yoke 4a, and constructed so that current flows in the direction perpendicular to the stacked face. The other TMR element 1b has: the magnetic yoke 4b disposed in correspondence with the area where the write bit line 5b and the write word line 6 cross each other and constructed so as to surround the whole periphery of the write bit line 5b and the write word line 6; and the stacked body S20b including the magneto-sensitive layer of which magnetization direction changes according to an external magnetic field, is magnetically coupled to the magnetic yoke 4b, and constructed so that current flows in the direction perpendicular to the stacked face. The TMR elements 1a and 1b share a common portion 34 as a part of the magnetic yokes 4a and 4b. At least a part of the magnetic yoke 4 and one of the write bit line 5 and the write word line 6 is made by a plating film.

The magneto-resistive layer is constructed by connection parts 14a and 14b as a part of the magnetic yokes 4a and 4b and second magnetic layers 8a and 8b which will be described later, respectively. The connection parts 14a and 14b and the second magnetic layers 8a and 8b are magnetically exchange-coupled to each other.

The stacked bodies S20a and S20b are constructed by the stacked parts 20a and 20b and the connection parts 14a and 14b, respectively. The stacked parts 20a and 20b are TMR films including, in order from the side of the magnetic yokes 4a and 4b (connection parts 14a and 14b), the second magnetic layers 8a and 8b, tunnel barrier layers 3a and 3b, and first magnetic layers 2a and 2b whose magnetization direction is fixed and constructed so that current flows in the direction perpendicular to the stacked face. As described above, the second magnetic layers 8a and 8b function as the magneto-sensitive layers together with the connection parts 14a and 14b of the magnetic yokes 4a and 4b. In FIG. 5A, to clarify the configuration of the stacked bodies S20a and S20b, the stacked bodies S20a and S20b are exaggerated so as to be larger relative to the peripheral parts.

When the magnetization directions of the pair of TMR elements 1a and 1b are inverted in the directions which are not parallel with each other, in the common portion 34, the directions of the current magnetic fields generated by the write bit lines 5a and 5b and the write word line 6 become the same and the magnetic flux density increases. Consequently, the current magnetic field can be used more efficiently, and the current necessary to invert the magnetization directions of the connection parts 14a and 14b of the magnetic yokes 4a and 4b and the second magnetic layers 8a and 8b can be further decreased. Since the magnetic yoke 4 is shared, the pair of TMR elements 1a and 1b can be easily formed, the formation area of the memory cell 1 can be reduced, and capacity of stored information can be increased.

In the stacked bodies S20a and S20b, when a voltage is applied in the direction perpendicular to the stacked face between the first magnetic layers 2a and 2b and the second magnetic layers 8a and 8b, for example, electrons in the first magnetic layers 2a and 2b pass through the tunnel barrier layers 3a and 3b and move to the second magnetic layers 8a and 8b, and tunnel current flows. The tunnel current changes according to a relative angle between the spin in the first magnetic layers 2a and 2b in the interface with the tunnel barrier layer 3 and the spin in the second magnetic layers 8a and 8b. Specifically, when the spin of the first magnetic layers 2a and 2b and that of the second magnetic layers 8a and 8b are parallel with each other, the resistance value becomes the minimum. When they are not parallel with each other, the resistance value becomes the maximum. By using the resistance values, the magneto-resistance change ratio (MR ratio) is defined as Equation (1).

$$MR \text{ ratio}=dR/R \quad (1)$$

where "dR" denotes the difference between the resistance value in the case where the spins are parallel with each other and that in the case where the spins are not parallel with each other, and "R" indicates the resistance value in the case where the spins are parallel with each other.

The resistance value against the tunnel current (hereinbelow, called tunnel resistance Rt) strongly depends on the thickness T of the tunnel barrier layer 3. In a low voltage region, as shown in Equation (2), the tunnel resistance Rt exponentially increases with the thickness T of the tunnel barrier layer 3.

$$Rt \propto \exp(2\chi^T), \chi=\{8\pi^2 m^*(\phi \cdot Ef)^{0.5}\}/h \quad (2)$$

where $\phi$ denotes the height of the barrier, "m*" denotes effective mass of electrons, "Ef" indicates Fermi energy, and h indicates a blank constant. Generally, in a memory element using the TMR element, to match with a semiconductor device such as a transistor, it is said that the proper tunnel resistance Rt is about 10 k$\Omega \cdot (\mu m)^2$. However, to realize higher packing density in the magnetic memory device and higher operating speed, the tunnel resistance Rt is set to, preferably, 10 k$\Omega \cdot (\mu m)^2$ or less, more preferably, 1 k$\Omega \cdot (\mu m)^2$ or less. Therefore, to realize the tunnel resistance Rt, it is desirable to set the thickness T of the tunnel barrier layer 3 to 2 nm or less, more preferably, 1.5 nm or less.

By reducing the thickness T of the tunnel barrier layers 3a and 3b, the tunnel resistance Rt can be reduced and, on the other hand, a leak current occurs due to roughness of the junction interface between the first magnetic layers 2a and 2b and the second magnetic layers 8a and 8b so that the MR ratio deteriorates. To prevent this, the thickness T of the tunnel barrier layers 3a and 3b has to be large to an extent that leak current does not flow. Concretely, the thickness T is desirably 0.3 nm or larger.

Desirably, the stacked bodies S20a and S20b have a coercive force difference type structure and the coercive force of the first magnetic layers 2a and 2b is larger than that of the second magnetic layers 8a and 8b. Concretely, the coercive force of the first magnetic layer 2 is preferably larger than $(50/4\pi) \times 10^3$ A/m, more preferably, $(100/4\pi) \times 10^3$ A/m. With the configuration, the magnetization direction of the first magnetic layers 2a and 2b can be prevented from being influenced by unnecessary magnetic fields such as external scattered magnetic fields or the like. The first magnetic layers 2a and 2b are made of, for example, cobalt iron alloy (CoFe) and have a thickness of 5 nm. Alternately, cobalt (Co), cobalt platinum alloy (CoPt), nickel iron cobalt alloy (NiFeCo), or the like can be applied to the first magnetic layers 2a and 2b. The second magnetic layers 8a and 8b are made of, for example, cobalt (Co), cobalt iron alloy (CoFe), cobalt platinum alloy (CoPt), nickel iron alloy (NiFe), or nickel iron cobalt alloy (NiFeCo). The axes of easy magnetization of the first magnetic layers 2a and 2b and the second magnetic layers 8a and 8b are preferably parallel with each other so that the magnetization direction of the first magnetic layers 2a and 2b and that of the second magnetic layers 8a and 8b are stabilized in a parallel or non-parallel state.

The magnetic yokes 4a and 4b extend so as to annularly surround at least a part of the parallel part 10 in the write bit line 5 and the write word line 6 and are constructed so that a return magnetic field is generated in the magnetic yokes 4a and 4b by current flowing in the parallel part 10. More specifically, as shown in FIG. 5B, the magnetic yoke 4a includes a pair of pillar yokes 421 and 422 extending in the growth direction (Z direction) of the plating film while facing each other, and a bottom yoke 41a and a top yoke 43a as a pair of beam yokes connecting with lower and upper ends of the pillar yokes 421 and 422. The magnetic yoke 4a has a closed sectional shape. The other magnetic yoke 4b includes a pair of pillar yokes 422 and 423 extending in the growth direction (Z direction) of the plating film while facing each other, and a bottom yoke 41b and a top yoke 43b as a pair of beam yokes connecting with lower and upper ends of the pillar yokes 422 and 423. The magnetic yoke 4b also has a closed sectional shape. The TMR elements 1a and 1b share the pillar yoke 422, a part of the bottom yokes 41a and 41b, and a part of the top yokes 43a and 43b and has the common portion 34 as shown in FIG. 5A. Each of the magnetization directions of such yokes 4a and 4b is inverted by the return magnetic field. In this case, the connection parts 14a and 14b of the magnetic yokes 4a and 4b and the second magnetic layers 8a and 8b adjacent to the connection parts 14a and 14b function as storage layers for storing information. The magnetic yokes 4a and 4b are made of, for example, nickel iron alloy (NiFe) and a part of the magnetic yokes 4a and 4b is made by a plating film. Consequently, the magnetic yokes 4a and 4b have high dimensional precision and sufficient thickness. Preferably, the coercive force of the connection parts 14a and 14b is smaller than that of the first magnetic layers 2a and 2b within the range of $(100/4\pi) \times 10^3$ A/m or less for the following reason. When the coercive force exceeds $(100/4\pi) \times 10^3$ A/m, there is the possibility that the stacked parts 20a and 20b themselves as the TMR films deteriorate due to heat generation caused by increase in write current. Further, when the coercive force of the connection parts 14a and 14b is equal to or larger than that of the first magnetic layers 2a and 2b, the write current increases, the magnetization direction of the first magnetic layers 2a and 2b as the magnetization fixed layer changes, and the stacked parts 20a and 20b as storage elements are destroyed. To make the current electric fields by the write bit lines 5a and 5b and the write word line 6 concentrated on the magnetic yokes 4a and 4b, the magnetic permeability of the magnetic yokes 4a and 4b is preferably high. Concretely, the magnetic permeability is preferably 2000 or higher and, more preferably, 6000 or higher.

Each of the write bit line 5 and the write word line 6 has a structure in which a film of titanium (Ti) having a thickness of 10 nm, a film of titanium nitride (TiN) having a thickness of 10 nm, and a film of aluminum (Al) having a thickness of 500 nm are sequentially stacked and are electrically insulated from each other via the insulating films 7. The write bit line 5 and the write word line 6 may be made of at least one of, for example, aluminum (Al), copper (Cu), and tungsten (W). A more concrete operation of writing information to the memory cell 1 by using the write bit line 5 and the write word line 6 will be described later.

Figure 6:
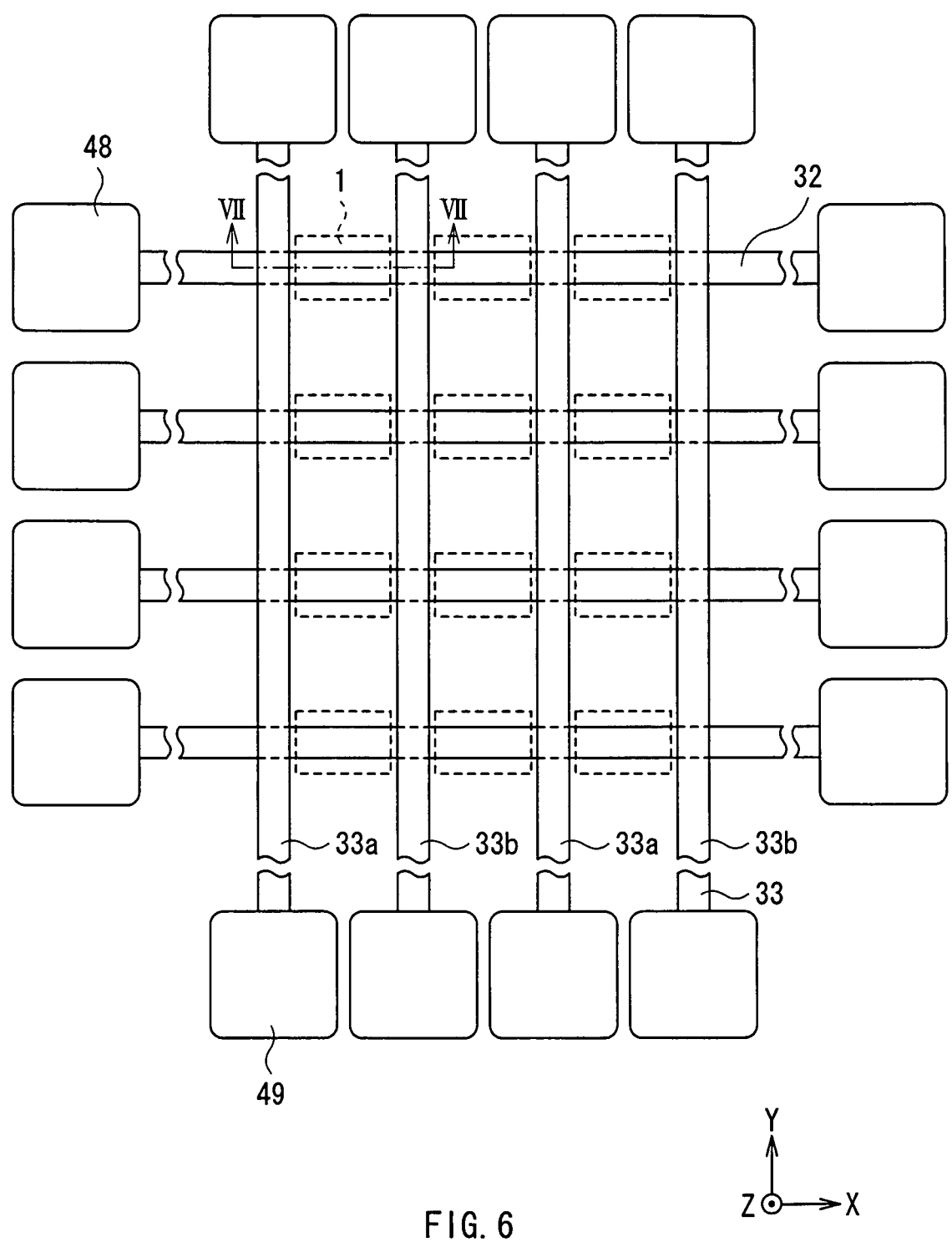
FIG. 6 is another partial plan view showing the configuration of the main part of the memory cell group in the magnetic memory device illustrated in FIG. 1.

The configuration related to information reading operation will now be described. FIG. 6 is a plan view showing the configuration of a main part related to the reading operation of the memory cell group 54 and corresponds to FIG. 3.

As shown in FIG. 6, each memory cell 1 is disposed at each of the intersecting points of the plurality of read word lines 32 and the plurality of read bit lines 33 in the XY plane. The stacked parts 20a and 20b on the under face of the memory cell 1 are connected to a pair of read bit lines 33a and 33b via the Schottky diodes 75a and 75b, and the top face (the side opposite to the stacked parts 20a and 20b) is in contact with the read word line 32. The read bit lines 33a and 33b supply read current to the pair of TMR elements 1a and 1b in each memory cell 1 and the read word line 32 leads the read current passed to the TMR elements 1a and 1b to the ground. At both ends of each read bit line 33, read bit line lead electrodes 49 are provided. At both ends of each read word line 32, read bit line lead electrodes 48 are provided.

Figure 7:
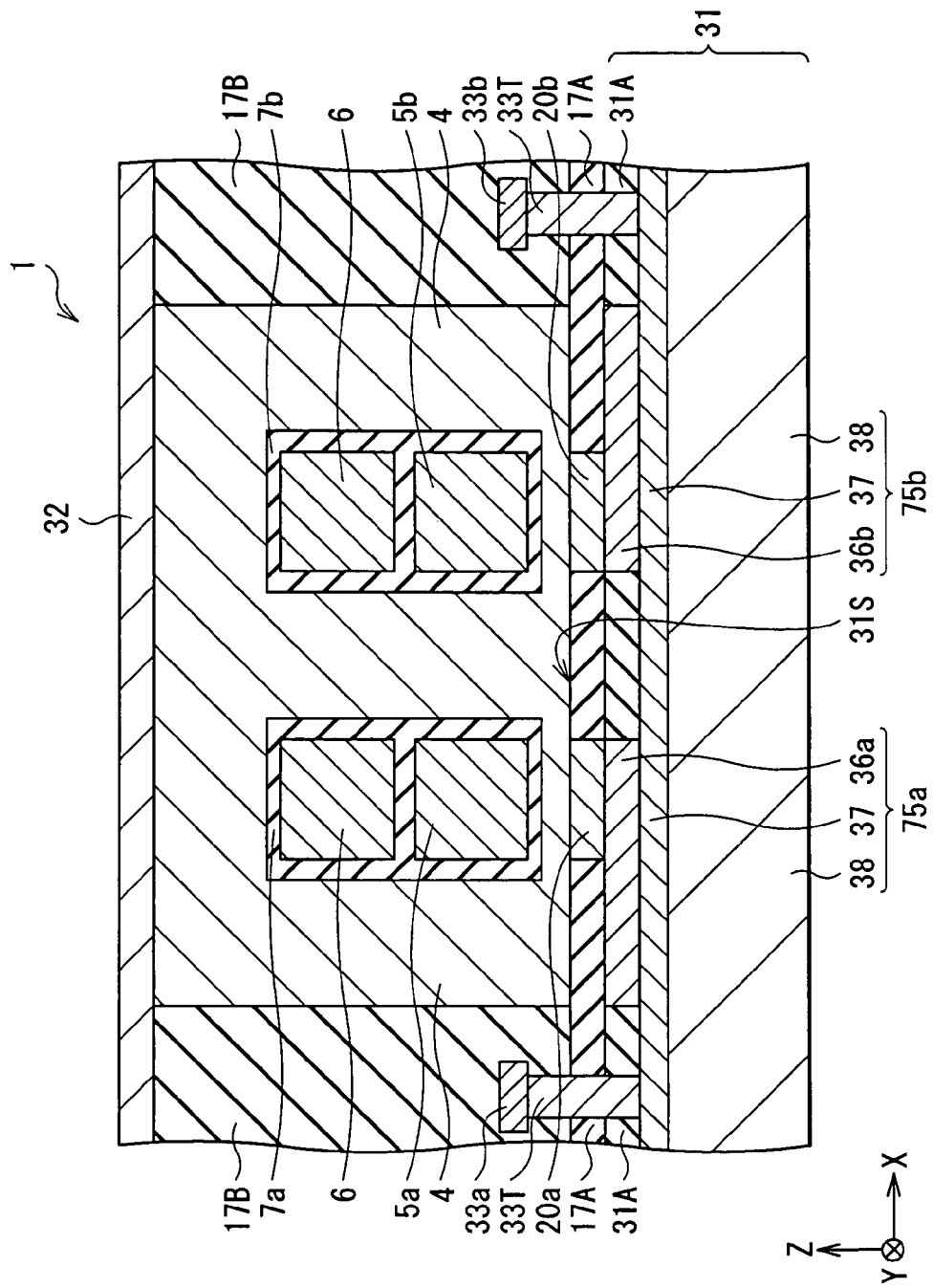
FIG. 7 is a cross section showing the configuration of a plane taken along line VII—VII of the memory cell illustrated in FIG. 6.

FIG. 7 is a cross section taken along line VII—VII of FIG. 6. As shown in FIG. 7, a magnetic memory device of the embodiment is constructed so that, in a region including the memory cell 1, a pair of stacked parts 20a and 20b and the magnetic yokes 4a and 4b are sequentially formed on a substrate 31 provided with the Schottky diode 75 (hereinbelow, simply called diode 75) functioning as a rectifier.

The pair of diodes 75a and 75b have the conductive layers 36a and 36b, an epitaxial layer 37, and a substrate 38 in order from the side of the stacked parts 20a and 20b. Between the conductive layers 36a and 36b and the epitaxial layer 37, a Schottky barrier is formed. The diodes 75a and 75b do not have an electrically connected part except for connection to the annular magnetic layer 4 while sandwiching the stacked parts 20a and 20b. The substrate 38 is an n− type silicon wafer. Generally, in the n− type silicon wafer, an impurity of phosphorus (P) is diffused. As the substrate 38, a wafer of an n++ type obtained by being highly doped with phosphorus is used. As the epitaxial layer 37, a wafer of the n− type obtained by being lightly doped with phosphorus is used. By making the epitaxial layer 37 as an n− type semiconductor and the conductive layers 36a and 36b made of a metal come into contact with each other, a band gap is created and a Schottky barrier is formed. Further, the pair of diodes 75a and 75b are connected to the read bit lines 33a and 33b, respectively, via a connection layer 33T.

Figure 8:
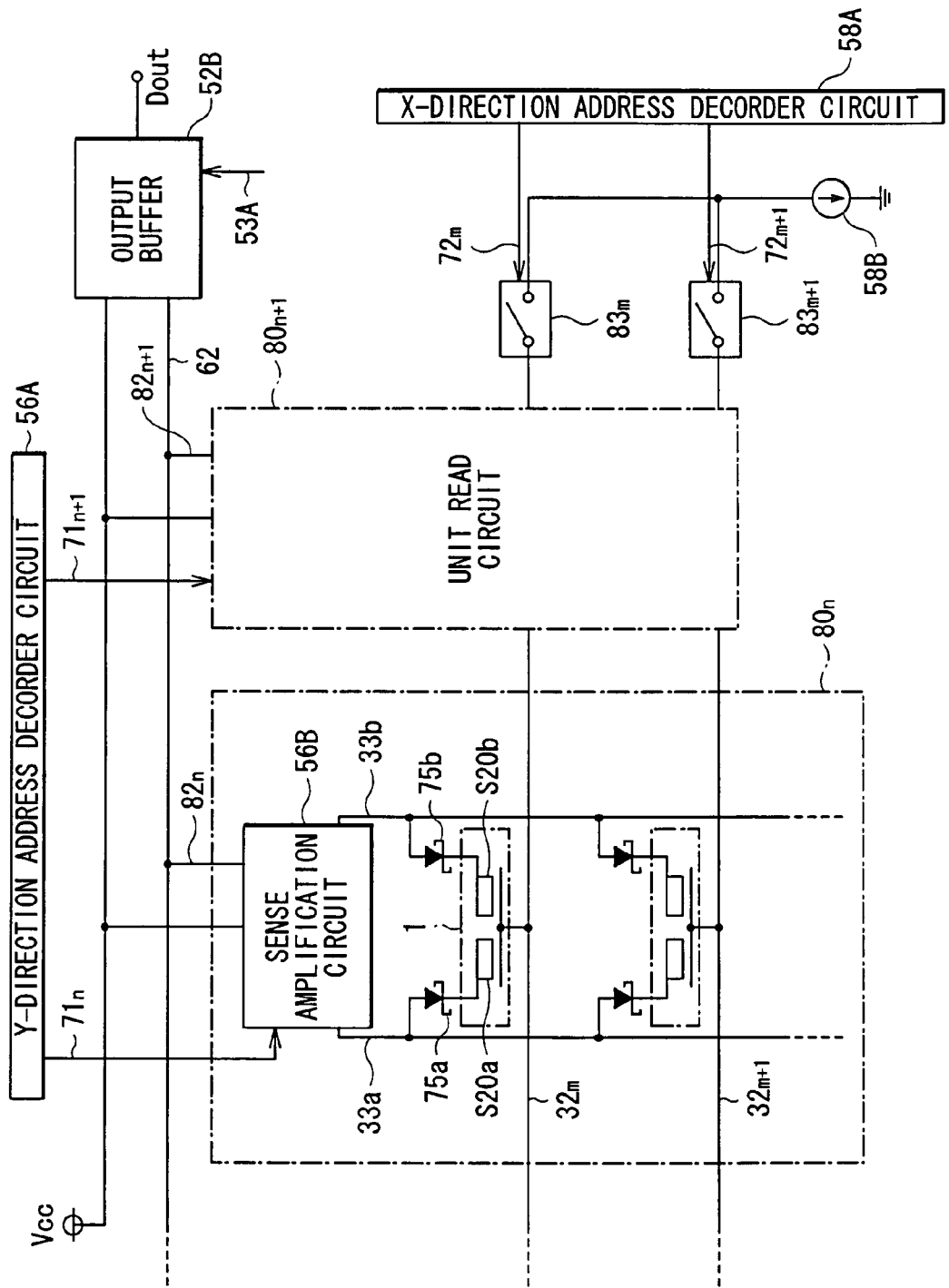
FIG. 8 is a circuit diagram showing the circuit configuration of the magnetic memory device illustrated in FIG. 1.

Referring now to FIG. 8, the circuit configuration related to the reading operation in the magnetic memory device of the embodiment will be described.

FIG. 8 is a configuration diagram of a circuit system constructed by the memory cell group 54 and a read circuit. In the read circuit system, the memory cell 1 is of a differential amplifier type constructed by the pair of TMR elements 1a and 1b. Information in the memory cell 1 is read by outputting a differential value of read currents passed to the TMR elements 1a and 1b (currents passed from the read bit lines 33a and 33b to the TMR elements 1a and 1b, respectively, and output to the common read word line 32).

In FIG. 8, a unit read circuit 80 ( . . . , 80n, 80n+1, . . . ) as a unit of repetition of the read circuit is constructed by the memory cells 1 of each bit line in the memory cell group 54 and a part of the read circuit including the sense amplification circuit 56B, and the unit read circuits 80n are arranged in the bit line direction. Each of the unit read circuits 80n is connected to the Y-direction address decoder circuit 56A via the bit decode line 71 ( . . . , 71n, 71n+1, . . . ) and is connected to the output buffer 52B via the Y-direction read data bus 62.

In the memory cell group 54, the read word lines 32 ( . . . , 32m, 32m+1, . . . ) arranged in the X direction and the pair of read bit lines 33a and 33b arranged in the Y direction are disposed in a matrix. Each of the memory cells 1 is disposed at the intersecting position with the read word line 32 in a region sandwiched by the pair of read bit lines 33a and 33b. Ends of each of the TMR elements 1a and 1b in each memory cell 1 are connected to the read bit lines 33a and 33b via the pair of diodes 75a and 75b and the other ends are connected to the common read word line 32.

One end of each read word line 32 is connected to a read switch 83 ( . . . , 83$_m$, 83$_{m+1}$, . . . ) via the read word line lead electrode 48 and is also connected to a common constant current circuit 58B. Each read switch 83 is connected to the X-direction address decoder circuit 58A via the word decode line 72 ( . . . , 72$_m$, 72$_{m+1}$, . . . ). The read switch 83 is made conductive when a selection signal from the X-direction address decoder circuit 58A is supplied. The constant current circuit 58B has the function of making the current flowing in the read word line 32 constant.

One end of each read bit line 33 is connected to the sense amplification circuit 56B via the read bit line lead electrode 49, and the other end is finally grounded. One sense amplification circuit 56B is provided per unit read circuit 80 and has the function of receiving the potential difference between the pair of read bit lines 33a and 33b in each unit read circuit 80, and amplifying the potential difference. The sense amplification circuit 56B is connected to the output line 82 ( . . . , 82n, 82n+1, . . . ) and is finally connected to the output buffer 52B via the Y-direction read data bus 62.

The operation in the magnetic memory device of the embodiment will now be described.

Referring now to FIG. 2 and FIGS. 9A and 9B, the writing operation in the memory cell 1 will be described. FIGS. 9A and 9B express the relation between the write current direction and the return magnetic field direction (magnetization direction) in the sectional configuration of the memory cell 1 shown in FIG. 5. The arrows indicated in magnetic layers in FIGS. 9A and 9B indicate the magnetization directions of the magnetic layers. With respect to the magnetic yokes 4a and 4b, the magnetic field directions of a magnetic path formed on the inside are also shown. The magnetization of the first magnetic layers 2a and 2b is fixed to the −X direction. FIGS. 9A and 9B show the case where write current flows in the same direction to the write bit line 5 and the write word line 6 which extend in the memory cell 1 and are parallel with each other. FIG. 9A corresponds to the write current direction shown in FIG. 2. FIG. 9A shows a case where write current flows from this side to the depth in the direction perpendicular to the drawing sheet (to the +Y direction) in the TMR element 1a, a return magnetic field 16a is generated in the clockwise direction in the potion of magnetic yoke 4a, which surrounds the write bit line 5a, write current flows from the depth to this side in the direction perpendicular to the drawing sheet (to the −Y direction) in the TMR element 1b, and the return magnetic field 16b is generated in the counterclockwise direction in the portion of magnetic yoke 4b, which surrounds the write bit line 5b. In this case, the magnetization direction of the connection part 14a and the second magnetic layer 8a becomes the −X direction and the magnetization direction of the connection part 14b and the second magnetic layer 8b becomes the +X direction. FIG. 9B corresponds to the case where the directions of current flowing in the write bit line 5 and the write word line 6 are opposite to those shown in FIG. 9A. Specifically, FIG. 9B shows a case where write current flows from the depth to this side in the direction perpendicular to the drawing sheet (to the −Y direction) in the TMR element 1a, the return magnetic field 16a is generated in the counterclockwise direction in the portion of magnetic yoke 4a, which surrounds the write bit line 5a, write current flows from this side to the depth in the direction perpendicular to the drawing sheet (to the +Y direction) in the TMR element 1b, and the return magnetic field 16b is generated in the clockwise direction in the magnetic yoke 4b of the portion surrounding the write bit line 5b. In this case, the magnetization direction of the connection part 14a and the second magnetic layer 8a is the +X direction and the magnetization direction of the connection part 14b and the second magnetic layer 8b is the −X direction.

In the cases of FIGS. 9A and 9B, the current direction of the write bit line 5a and the write word line 6 penetrating the TMR element 1a and that of the write bit line 5b and the write word line 6 penetrating the TMR element 1b are opposite to each other. Consequently, the directions of the return magnetic fields 16a and 16b flowing in the pillar yoke 422 (refer to FIG. 5) corresponding to the common part 34 of the magnetic yokes 4a and 4b can be made the same (the +Z direction in FIG. 9A and the −Z direction in FIG. 9B).

As obvious from FIGS. 9A and 9B, according to the directions of the return magnetic field 16a and 16b generated by the currents flowing in the write bit line 5 and the write word line 6 penetrating the magnetic yokes 4a and 4b, the magnetization direction of the connection part 14a and the second magnetic layer 8a and that of the connection part 14b and the second magnetic layer 8b change so as to be opposite to each other. By using the phenomenon, information can be stored in the memory cell 1.

In short, when current flows in the same direction in the write bit lines 5a and 5b and the write word line 6, the magnetization directions of the magnetic yokes 4a and 4b are inverted and, accompanying the inversion, the magnetization directions of the second magnetic layers 8a and 8b change, thereby enabling binary information of "0" or "1" to be stored. In the case where "0" corresponds to, for example, the state of FIG. 9A, specifically, the state where the connection part 14a and the second magnetic layer 8a are magnetized in the −X direction and the other connection part 14b and the second magnetic layer 8b are magnetized in the +X direction, "1" corresponds to the state of FIG. 9B, specifically, the state where the connection part 14a and the second magnetic layer 8a are magnetized in the +X direction and the other connection part 14b and the second magnetic layer 8b are magnetized in the −X direction. In such a manner, information can be stored.

In this case, in the TMR elements 1a and 1b, when the magnetization direction of the first magnetic layers 2a and 2b and that of the second magnetic layers 8a and 8b are parallel with each other, a low resistance state in which large tunnel current flows is obtained. When they are not parallel with each other, a high resistance state in which only small tunnel current flows is obtained. That is, one of the pair of TMR elements 1a and 1b is in the low resistance state and the other is in the high resistance state, thereby storing information. In the case where the write currents flow in the opposite directions in the write bit line 5 and the write word line 6 or in the case where the write current flows only in one of the write bit line 5 and the write word line 6, the magnetization direction of the second magnetic layer 8 is not inverted and the data is not rewritten.

As described above, in the memory cell 1 in the magnetic memory device of the embodiment having the configuration, by passing the currents in the same direction to both of the write bit line 5 and the write word line 6, the direction of the current magnetic field generated by the write bit line 5 and that of the current magnetic field generated by the write word line 6 become the same in the magnetic yoke 4, so that a synthetic magnetic field can be generated. Consequently, as compared with the case where the magnetic yoke 4 is not provided and the case where the write bit line 5 and the write word line 6 perpendicularly cross each other, higher magnetic flux density is obtained. Thus, the current magnetic field can be used more efficiently and the current necessary to invert the magnetization in the connection part 14 of the magnetic yoke 4 and the second magnetic layer 8 can be reduced.

Further, since the second magnetic layer 8 is provided between the tunnel barrier layer 3 and the connection part 14 of the magnetic yoke 4, the following advantages are obtained. Exchange coupling between the connection part 14 and the second magnetic layer 8 can be formed and the magnetization direction in the second magnetic layer 8 as the second magneto-sensitive part is aligned more excellently, so that more stable writing can be performed. Further, the coercive force of the connection part 14 can be suppressed more, so that a heat generation amount can be decreased by reducing the current value in the writing operation, and the functions of the magnetic memory device can be fully displayed.

Referring now to FIGS. 1 and 8, the reading operation in the magnetic memory device of the embodiment will be described.

First, one of the bit decode lines 71 is selected by the address decoder circuit 56A in the first drive control circuit part 56 and a control signal is transmitted to the corresponding sense amplification circuit 56B. As a result, read current flows in the read bit lines 33a and 33b and the positive potential is given to the side of the stacked bodies S20a and S20b in the TMR elements 1a and 1b. Similarly, by the X-direction address decoder circuit 58A in the second drive control circuit part 58, one of the plurality of word decode lines 72 is selected and the read switch 83 in the corresponding part is driven. The selected read switch 83 is made conductive, read current flows in the corresponding read word line 32, and a negative potential is given to the side opposite to that of the stacked bodies S20a and S20b. Therefore, read current necessary for reading can be passed to one memory cell 1 selected by the Y-direction address decoder circuit 56A and the X-direction address decoder circuit 58A. Based on the read current, the magnetization directions of the pair of second magnetic layers 8a and 8b are detected, thereby enabling stored information to be read.

Figure 10A:
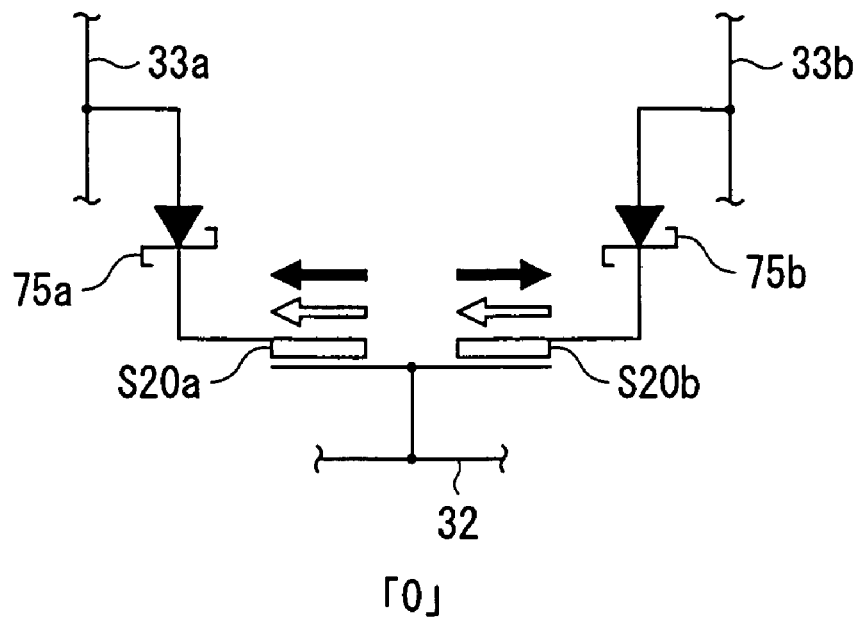
FIGS. 10A and 10B is a partial enlarged view of the circuit configuration illustrated in FIG. 8.
Figure 10B:
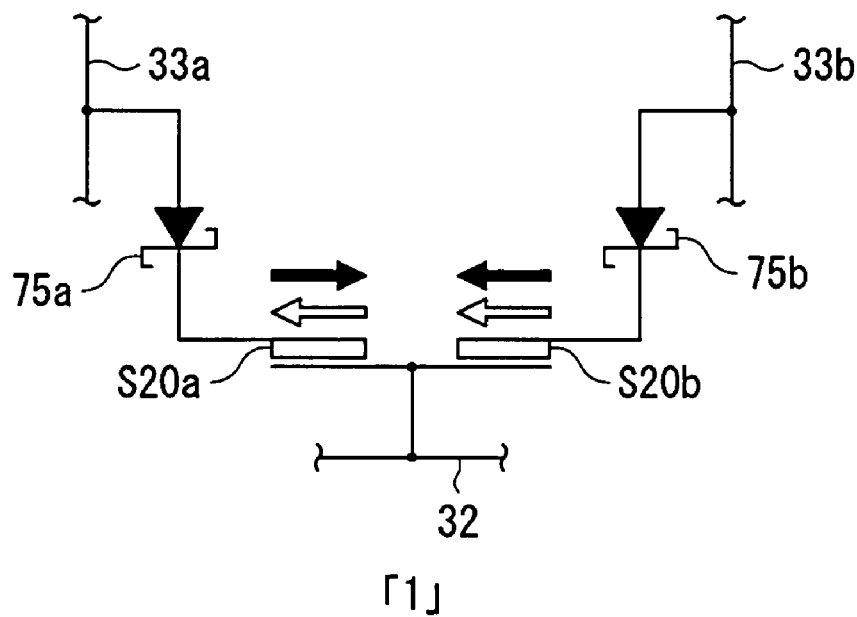

FIGS. 10A and 10B are circuit diagrams each showing a portion around the memory cell 1. The magnetization directions of the first magnetic layers 2a and 2b in the stacked bodies S20a and S20b are indicated by hollow arrows and those of the second magnetic layers 8a and 8b are indicated by solid arrows. Both of the magnetization directions of the first magnetic layers 2a and 2b are fixed to the left directions. In FIG. 10A, the magnetization direction of the first magnetic layer 2a and that in the second magnetic layer 2b in the stacked body S20a are the same, and the magnetization direction of the first magnetic layer 2b and that of the second magnetic layer 2b in the other stacked body S20b are opposite to each other. In this case, the stacked body S20a is in the low resistance state, and the stacked body S20b is in the high resistance state. This case corresponds to, for example, "0". In the other case of FIG. 10B, different from the case of FIG. 10A, the stacked body S20a is in the high resistance state and the stacked body S20b is in the low resistance state. This case corresponds to, for example, "1". Such binary information can be obtained by detecting the difference between the current values due to the difference between values of the stacked bodies S 20a and S20b.

In the magnetic memory device of the embodiment, with the configuration as described above, by passing current to both of the write bit line 5 and the write word line 6, a closed magnetic path can be formed, the magnetization can be inverted efficiently in the magnetic yokes 4a and 4b in the TMR elements 1a and 1b, and the magnetic influence on a memory cell adjacent to the memory cell 1 to be written can be reduced. Since a part of the magnetic yokes 4a and 4b, write bit lines 5a and 5b and the write word line 6 are made by a plating film, the magnetic yokes 4a and 4b, write bit lines 5a and 5b, and write word line 6 can assure high dimensional precision and sufficient thickness. Consequently, a return magnetic field sufficient to perform stable magnetization inversion can be generated in the magnetic yoke 4 and the more stable writing and reading operations can be performed. Further, by the shield effect of the magnetic yokes 4a and 4b, the intervals of neighboring memory cells can be narrowed on the substrate. Thus, it is advantageous for higher integration and higher packing density of the magnetic memory device.

A method of manufacturing the magnetic memory cell having the configuration as described in the embodiment and a method of manufacturing the magnetic memory device having the configuration as described in the embodiment will now be described.

In the methods of manufacturing the magnetic memory cell and the magnetic memory device having the magnetic memory cell in the embodiment, at least a part of the annular magnetic layer is formed by plating. Hereinbelow, referring to FIGS. 11 to 27, the method of manufacturing mainly the memory cell 1 in the magnetic memory device will be concretely described. FIGS. 11 to 27 are cross sections corresponding to FIG. 7 and show manufacturing processes in order.

Figure 11:
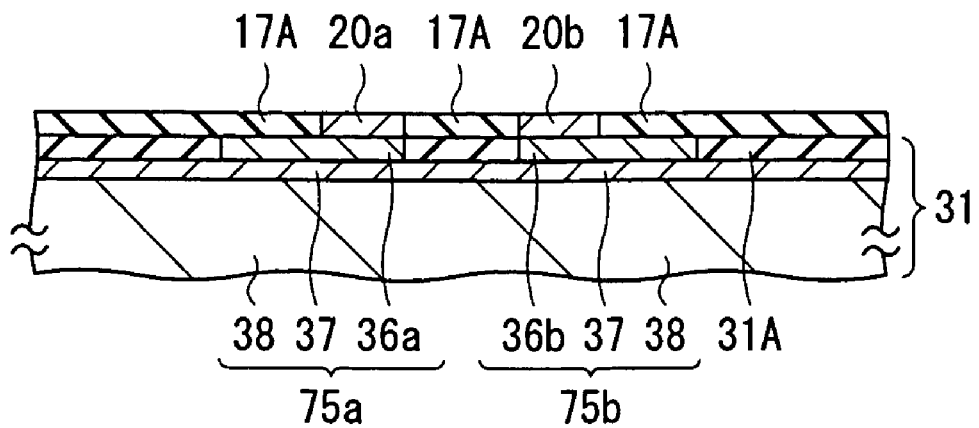
FIG. 11 is an enlarged cross section showing a process in a method of manufacturing the magnetic memory device illustrated in FIG. 1.
Figure 12:
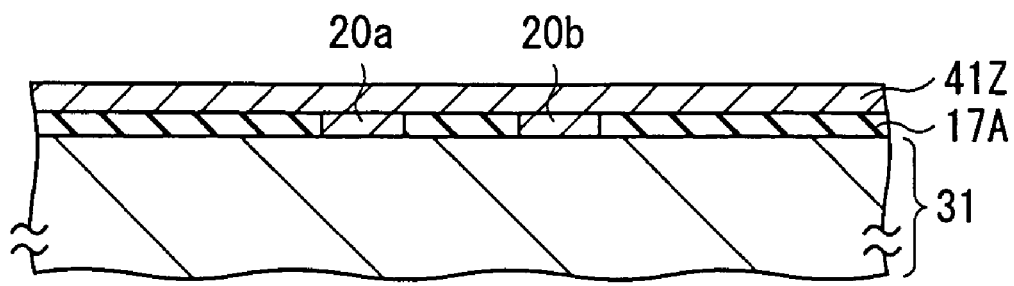
FIG. 12 is an enlarged cross section showing a process subsequent to FIG. 11.
Figure 13:
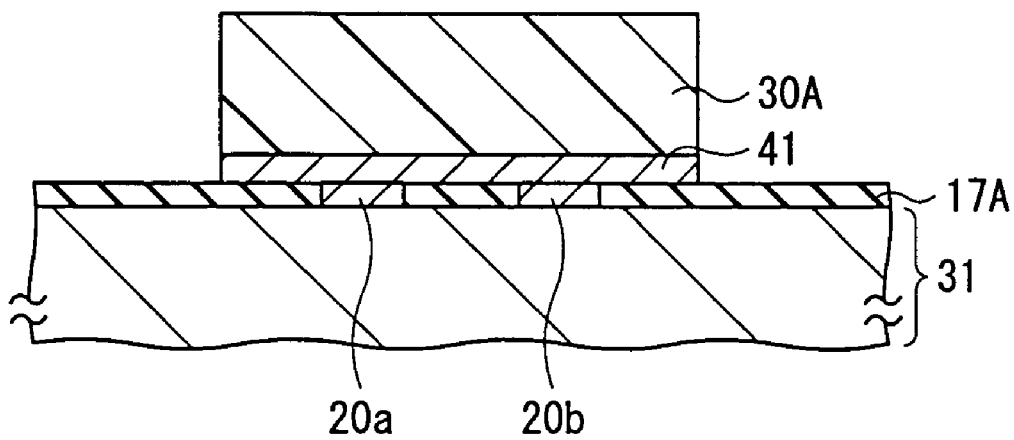
FIG. 13 is an enlarged cross section showing a process subsequent to FIG. 12.

In the first process, a bottom yoke 41 is formed on the substrate 31 via the stacked parts S20a and S20b. First, as shown in FIG. 11, the substrate 31 in which the diodes 75a and 75b are buried and on which the stacked parts S20a and S20b and the insulating film 17A surrounding the periphery of the stacked parts S20a and S20b is prepared. In FIGS. 12 to 27 subsequent to FIG. 11, the details of the substrate 31 will be omitted. Subsequently, as shown in FIG. 12, a metal film 41Z made of nickel iron alloy (NiFe) is formed by, for example, sputtering on the entire surface. After that, as shown in FIG. 13, a resist pattern 30A in a predetermined shape is formed on the metal film 41Z of the region corresponding to the stacked parts S20a and S20b. By removing the unnecessary metal film 41Z by milling or the like, the bottom yoke 41 (41a and 41b) is obtained. Generally, such a thin film patterning method is called milling.

Figure 14:
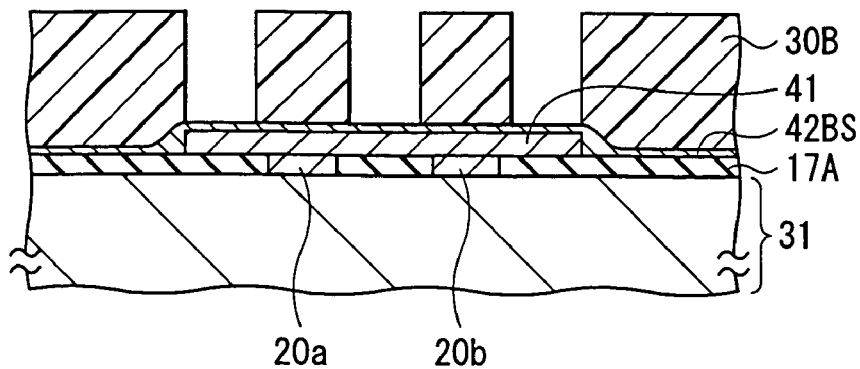
FIG. 14 is an enlarged cross section showing a process subsequent to FIG. 13.
Figure 15:
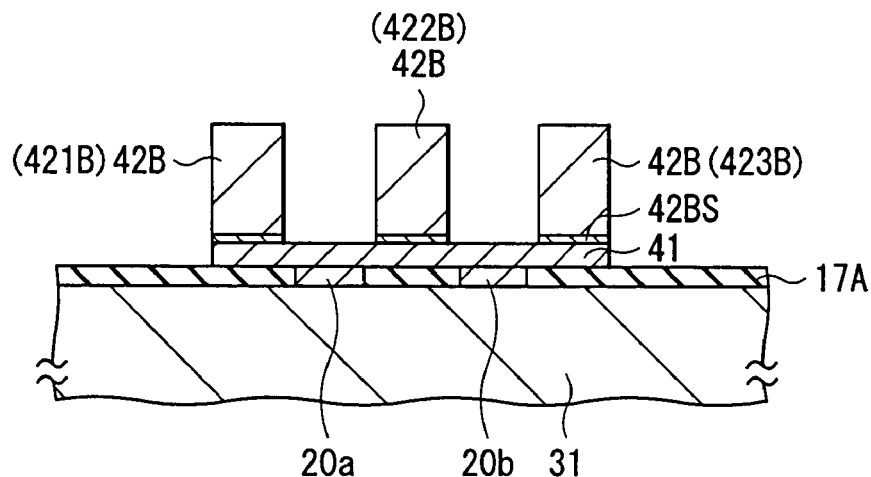
FIG. 15 is an enlarged cross section showing a process subsequent to FIG. 14.

In the following second process, on the bottom yoke 41, three bottom pillar yokes 42B (421B, 422B, and 423B) are formed. First, the resist pattern 30A is removed and, as shown in FIG. 14, an underplating film 42BS made of NiFe is formed on the entire surface by, for example, sputtering. On the underplating film 42BS, a resist pattern 30B is selectively formed. In this case, a region for forming the bottom pillar yoke 42B is left. After that, the resultant is soaked in a plating solution and a plating process using the underplating film 42BS as an electrode is performed, thereby forming the three bottom pillar yokes 42B made of, for example, NiFe as shown in FIG. 15. After forming the bottom pillar yokes 42B, the resist pattern 30B is peeled off, and the exposed underplating film 42BS is removed by milling or the like. Generally, such a thin film patterning method is called a frame plating method.

Figure 16:
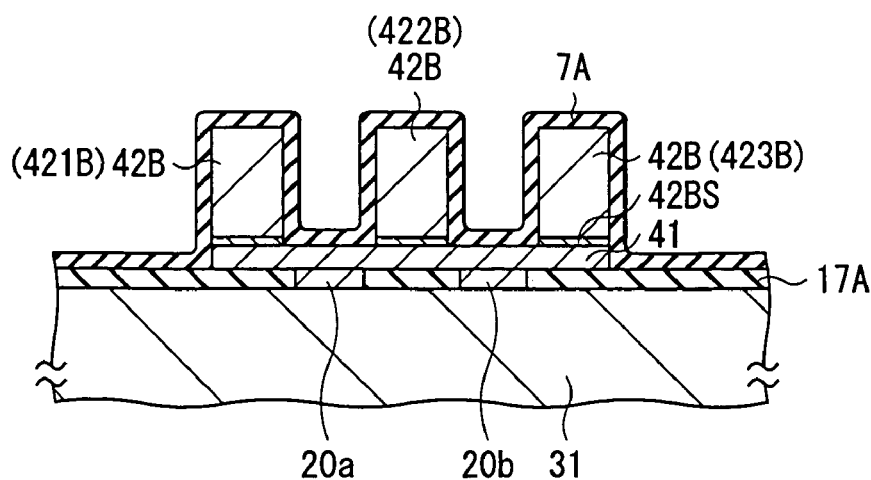
FIG. 16 is an enlarged cross section showing a process subsequent to FIG. 15.
Figure 17:
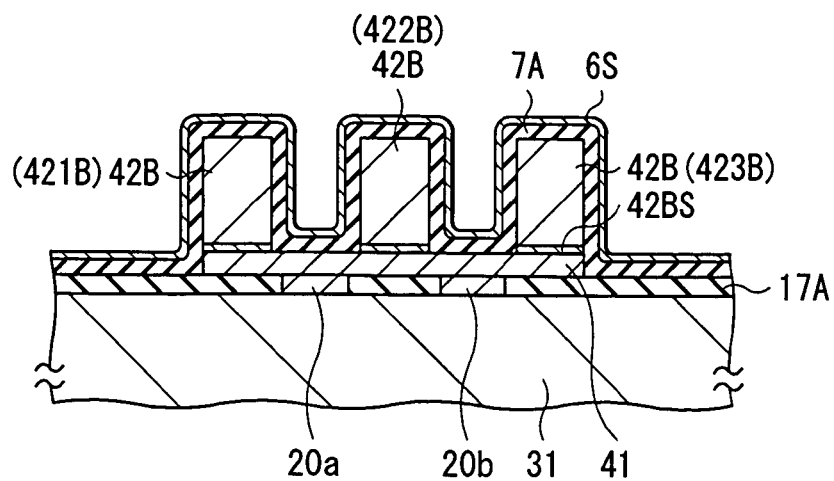
FIG. 17 is an enlarged cross section showing a process subsequent to FIG. 16.
Figure 18:
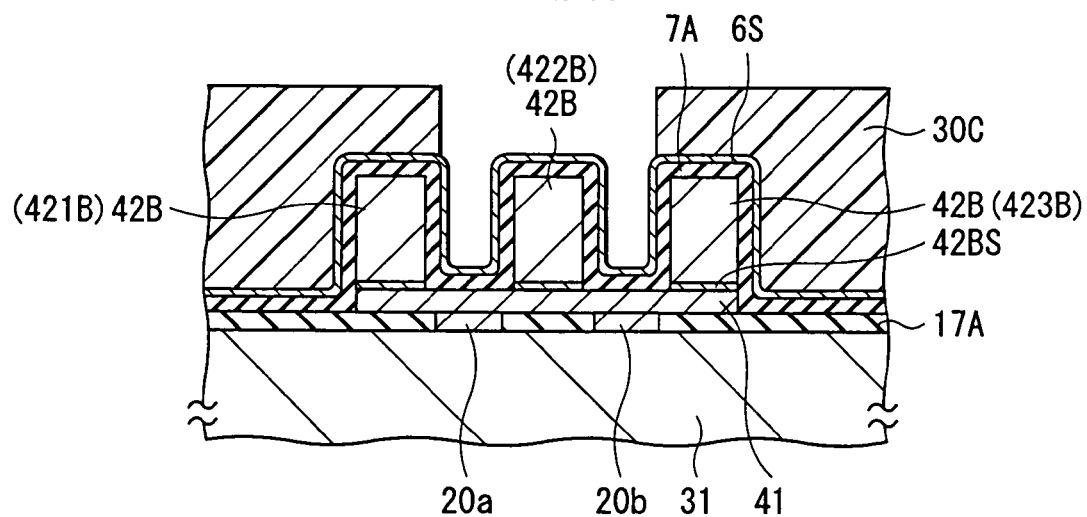
FIG. 18 is an enlarged cross section showing a process subsequent to FIG. 17.
Figure 19:
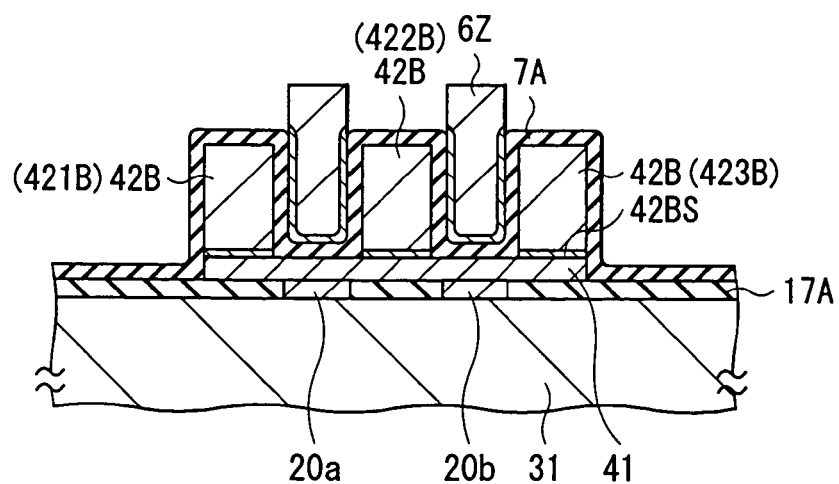
FIG. 19 is an enlarged cross section showing a process subsequent to FIG. 18.
Figure 20:
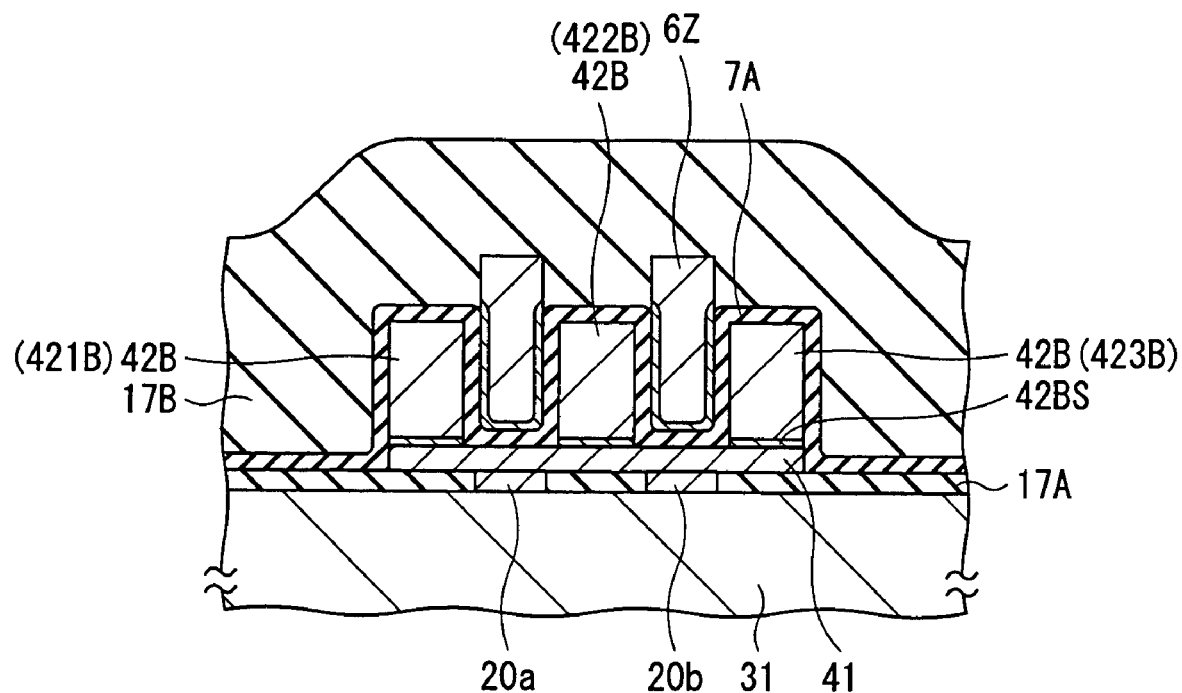
FIG. 20 is an enlarged cross section showing a process subsequent to FIG. 19.
Figure 21:
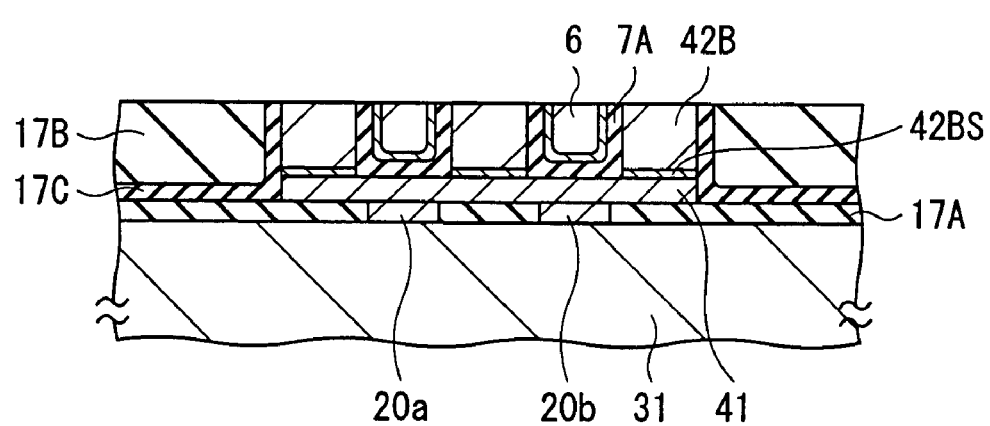
FIG. 21 is an enlarged cross section showing a process subsequent to FIG. 20.

In the following third process, the write word lines 6 are formed between the bottom pillar yokes 42B via insulating films 7A. In this case, first, as shown in FIG. 16, the insulating film 7A made of $Al_2O_3$ or the like is formed so as to cover the whole by using, for example, a CVD apparatus. After that, as shown in FIG. 17, an underplating film 6S made of, for example, copper is formed so as to cover the insulating film 7A by sputtering or the like. After that, as shown in FIG. 18, a resist pattern 30C is selectively formed so as to leave the region between the bottom pillar yokes 42B. Further, as shown in FIG. 19, a metal layer 6Z is formed so as to bury at least the regions between the bottom pillar yokes 42B. In this case, the resultant is soaked in a plating solution and a plating process using the underplating film 6S as an electrode is performed, thereby forming the metal layer 6Z made of copper. After that, the resist pattern 30C is peeled off and the exposed underplating film 6S is removed by milling or the like. Further, as shown in FIG. 20, an insulating film 17B made of, for example, $Al_2O_3$ is formed so as to cover the whole by sputtering or the like. After that, as shown in FIG. 21, the whole face is polished to a predetermined thickness so as to be planarized by using, for example, a CMP apparatus. In such a manner, the write word line 6 is formed.

Figure 22:
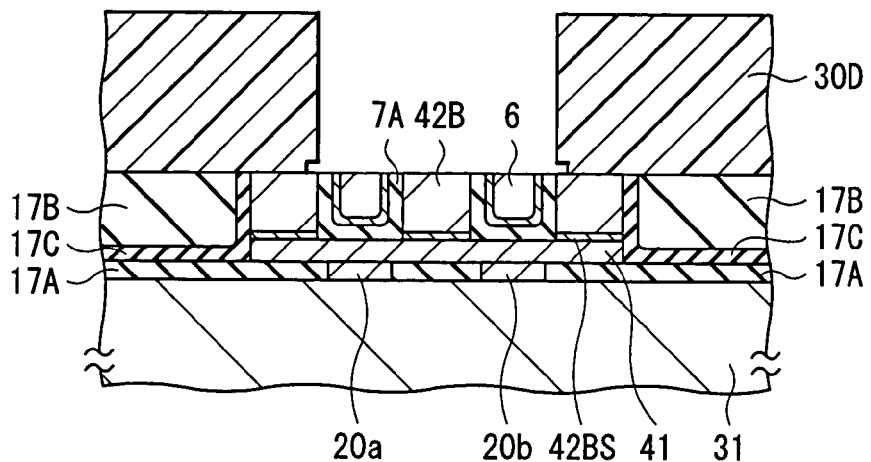
FIG. 22 is an enlarged cross section showing a process subsequent to FIG. 21.
Figure 23:
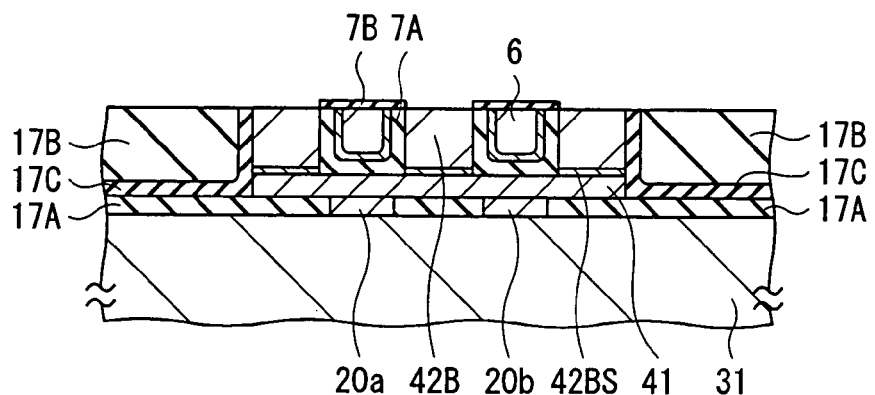
FIG. 23 is an enlarged cross section showing a process subsequent to FIG. 22.
Figure 24:
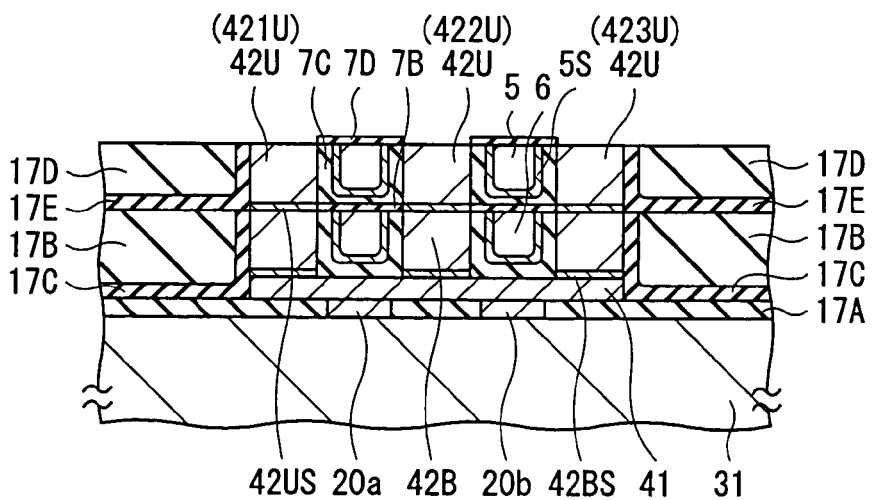
FIG. 24 is an enlarged cross section showing a process subsequent to FIG. 23.

In the following fourth process, an insulating film 7B is formed so as to cover the top face of the write word line 6 and surround the periphery of the write word line 6 in cooperation with the insulating film 7A. Concretely, as shown in FIG. 22, a resist pattern 30D is selectively formed in regions except for the region in which the write word line 6, underplating film 6S, and insulating film 7A are exposed in the surface. After that, the resist pattern 30D is used as a mask and sputtering is performed, thereby forming the insulating film 7B made of, for example, $Al_2O_3$ as shown in FIG. 23. Further, by removing the resist pattern 30D, the insulating film 7B covering the write word line 6, underplating film 6S, and the insulating film 7A appears. By forming an undercut in a lower part of the end face of the resist pattern 30D, the resist pattern 30D can be easily peeled off.

In a fifth process, three top pillar yokes 42U (421U, 422U, and 423U) are formed on the three bottom pillar yokes 42B (421B, 422B, and 423B). The top pillar yokes 42U can be formed by repeating an operation similar to the process of forming the bottom pillar yokes 42B shown in FIGS. 14 and 15. In a sixth process, the write bit lines 5 (5a and 5b) are formed via the insulating film 7C between the top pillar yokes 42U. The write bit lines 5 can be formed by repeating an operation similar to that of forming the write word lines 6 shown in FIGS. 16 to 23. Further, in a seventh process, an insulating film 7D is formed so as to cover the top face of the write bit line 5 and surround the periphery of the write bit line 5 in cooperation with the insulating film 7C. Hereinbelow, by referring to FIG. 24, the fifth to seventh processes will be described concretely.

In the fifth process, first, the insulating film 7B is formed in the fourth process and, after that, an underplating film 42US made of NiFe is formed on the entire face by, for example, sputtering. After that, a resist pattern (not shown) is selectively formed on the underplating film 42US. In this case, the region for forming the top pillar yoke 42U is left.

The resultant is soaked in a plating solution, and a plating process using the underplating film 42US as an electrode is performed, thereby forming the top pillar yoke 42U made of, for example, NiFe. After forming the top pillar yoke 42U, the resist pattern is peeled off, and the exposed underplating film 42US is removed by milling or the like. In the following sixth process, an insulating film 7C made of $Al_2O_3$ or the like is formed so as to cover the whole by using, for example, a CVD apparatus. After that, the underplating film 5S made of, for example, copper is formed so as to cover the insulating film 7C by sputtering or the like. A resist pattern (not shown) is selectively formed so as to leave the regions between the top pillar yokes 42U. Further, the write bit lines 5 are formed so as to bury the region between the top pillar yokes 42U. In this case, the resultant is soaked in a plating solution and a plating process using the underplating film 5S as an electrode is performed, thereby forming the write bit line 5 made of copper. After formation of the write bit line 5, the resist pattern is peeled off and the underplating film 5S is removed by milling or the like. Further, an insulating film 17D made of, for example, $Al_2O_3$ is formed so as to cover the whole by sputtering or the like. After that, the whole face is polished to a predetermined thickness so as to be planarized by using, for example, a CMP (Chemical Mechanical Polishing) apparatus. In the following seventh process, a resist pattern (not shown) is selectively formed in regions except for the region in which the write bit line 5, underplating film 5S, and insulating film 7C are exposed in the surface. The resist pattern is used as a mask and sputtering is performed, thereby forming the insulating film 7D made of, for example, $Al_2O_3$. By removing the resist pattern, the insulating film 7D covering the write bit line 5, underplating film 5S, and the insulating film 7C appears.

Figure 25:
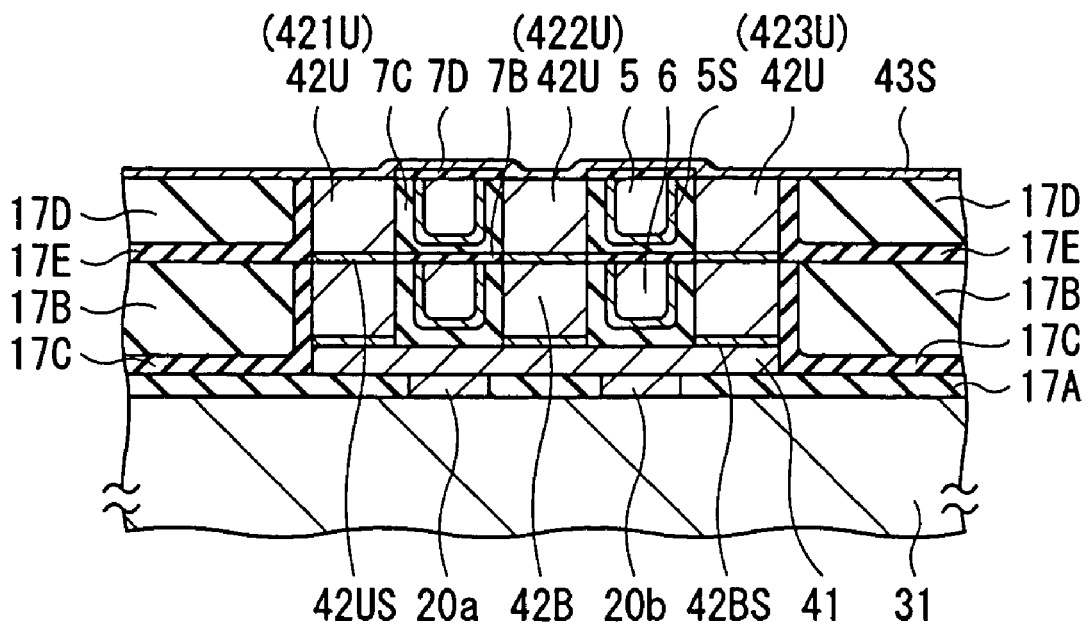
FIG. 25 is an enlarged cross section showing a process subsequent to FIG. 24.
Figure 26:
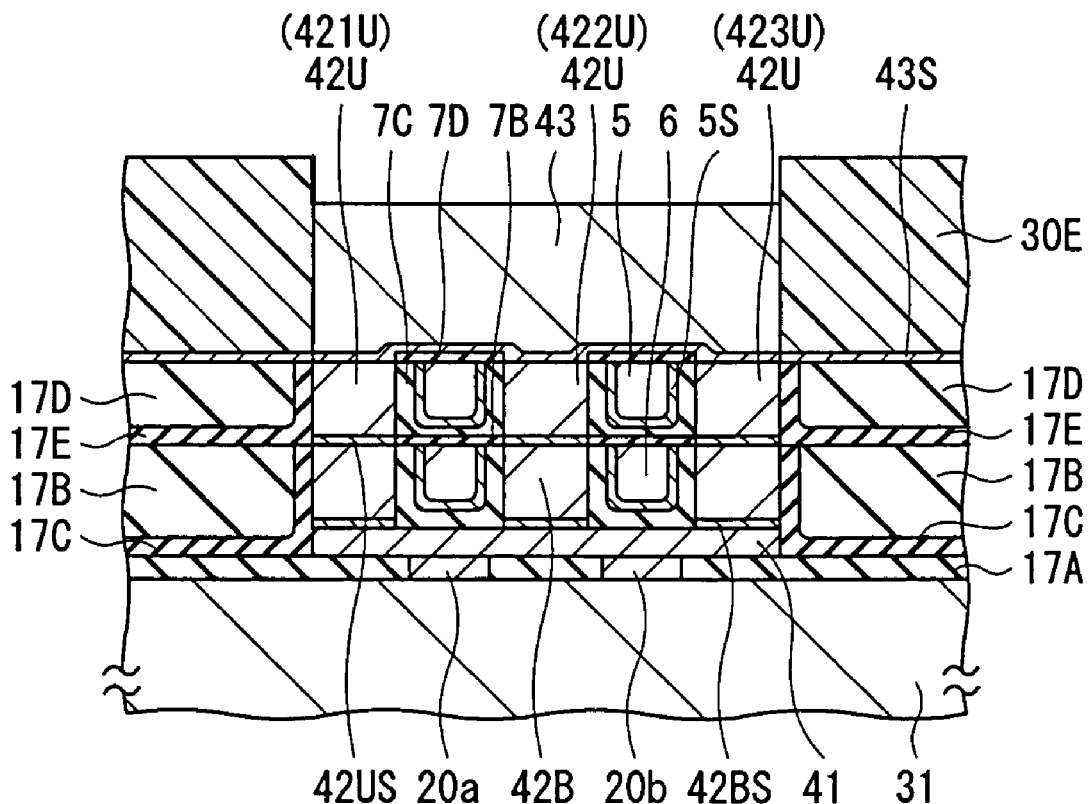
FIG. 26 is an enlarged cross section showing a process subsequent to FIG. 25.
Figure 27:
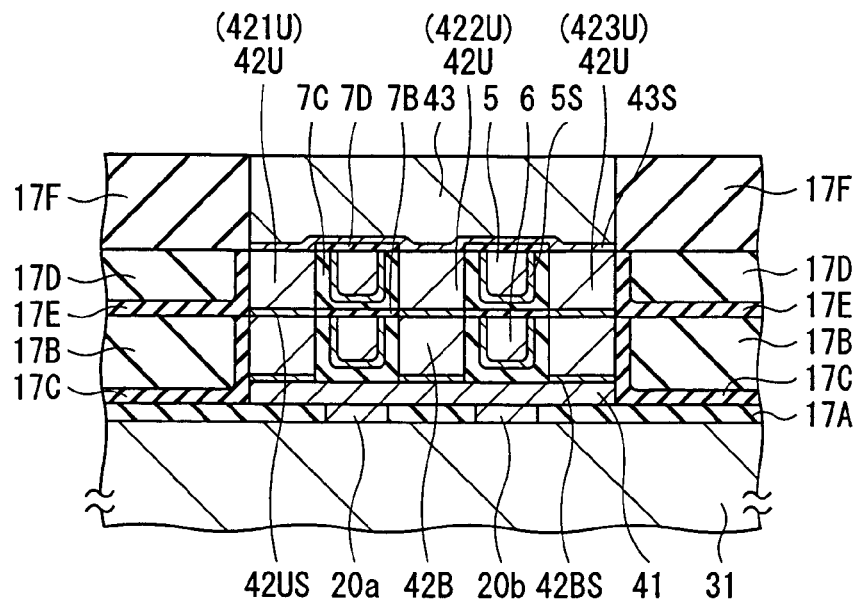
FIG. 27 is an enlarged cross section showing a process subsequent to FIG. 26.

In the following eighth process, by providing the top yoke 43 so as to cover the top pillar yoke 42U and the insulating film 7D, formation of the magnetic yoke 4 constructed by the bottom yoke 41, the pair of bottom and top pillar-shaped magnetic layers 42B and 42U and the top yoke 43 is completed. Concretely, first, as shown in FIG. 25, the underplating film 43S is formed so as to cover the whole by sputtering or the like. Next, as shown in FIG. 26, a resist pattern 30E is selectively formed so as to avoid the region corresponding to the formation region of the bottom yoke 41. The resist pattern 30E is used as a mask and a plating process using the underplating film 43S is performed, thereby forming the top yoke 43 made of, for example, NiFe. After formation of the top yoke 43, the resist pattern 30E is peeled off and the exposed underplating film 43S is removed by milling or the like. Subsequently, an insulating film 17F made of $Al_2O_3$ or the like is formed on the whole face. As shown in FIG. 27, the whole face is polished to a predetermined thickness by using, for example, a CMP apparatus and planarized. The formation of the magnetic yoke 4 is completed and the memory cell 1 is completed. Further, the read word line 32 having a desired width is formed so as to be electrically connected to the top yoke 43.

After that, the write word line lead electrodes 46 are formed at both ends of the write word line 6, the write bit line lead electrodes 47 are formed at both ends of the write bit line 5, the read word line lead electrodes 48 are formed at both ends of the read word line 32 and, further, the read bit line lead electrodes 49 are formed at both ends of the read bit line 33.

In such a manner, formation of the memory cell group 54 including the memory cells 1 is completed.

Further, by performing a process of forming a protection layer made of silicon oxide ($SiO_2$), $Al_2O_3$, or the like by a sputtering apparatus, a CVD apparatus, or the like and a process of polishing the protection layer to expose the lead electrodes 46 to 49, manufacture of the magnetic memory device is completed.

As described above, in the embodiment, the bottom and top pillar yokes 42 and top yokes 43 in the magnetic yoke 4, write bit line 5, and write word line 6 are formed by plating. When they are formed by a dry film forming method by sputtering or the like and a dry film forming method combined with a dry patterning method such as milling, reactive ion etching, or the like, the following problems occur. First, in the dry film forming method such as sputtering, although it is easy to form a thin film of a few nm or less, it is not suitable for reasons such that it takes time to form a functional film having a thickness of hundreds nm. When a film to be patterned is subjected to dry etching by using the resist pattern as a mask, generally, the resist pattern itself is also etched and the film is reduced not only in the thickness direction but also in the width direction (in-plane direction). Moreover, the gradient of the end face of the film to be patterned tends to become gentle. Consequently, it is difficult to obtain high dimensional precision.

One of methods of making the gradient of the end face of the film to be patterned sharp is a method of using an inorganic mask material having a low etching rate (which is not easily etched). In this case, however, the unnecessary inorganic mask material remains on the film to be patterned, so that it is difficult to apply the method to the method of manufacturing the magnetic memory device in the embodiment.

In contrast, in the manufacturing method of the embodiment, the bottom and top pillar yokes 42, top yoke 43, write bit line 5 and write word line 6 in the magnetic yoke 4 are formed by plating. Consequently, as compared with the case where they are formed by a dry method such as sputtering, a larger edge angle can be realized and the yoke 4, write bit line 5 and write word line 6 can be formed with high precision and with sufficient thickness. Consequently, neighboring memory cells can be disposed at smaller intervals on the substrate, and the magnetic memory device realizing higher integration and higher packing density can be formed.

EXAMPLES

Concrete examples in the embodiment will now be described.

Figure 28A:
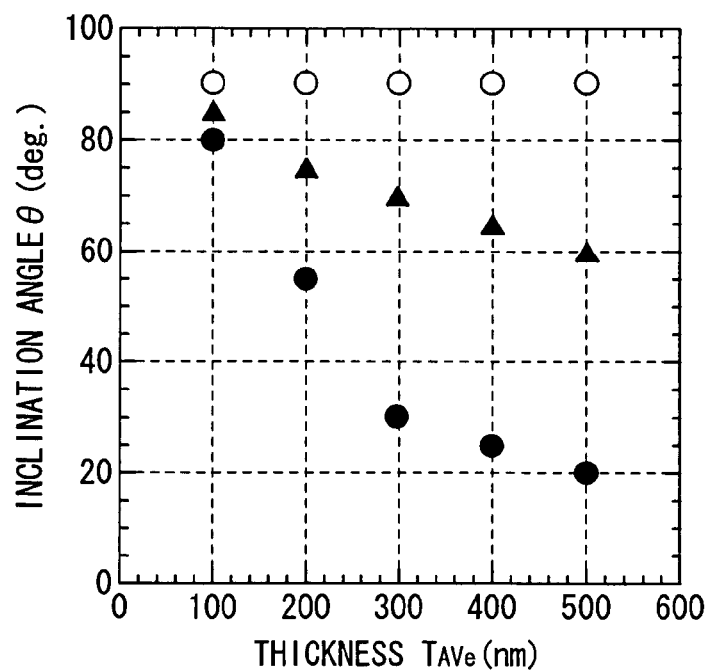
FIGS. 28A and 28B are diagrams illustrating shape characteristics of a film to be patterned by a frame plating method applied as a part of the method of manufacturing the memory cell shown in FIGS. 5A and 5B.

First, the inclination angle θ of the end face in the film to be patterned which is made of NiFe and formed by the frame plating method of the embodiment and that formed by the dry film forming method were compared with each other. FIG. 28A shows the result.

Figure 28B:
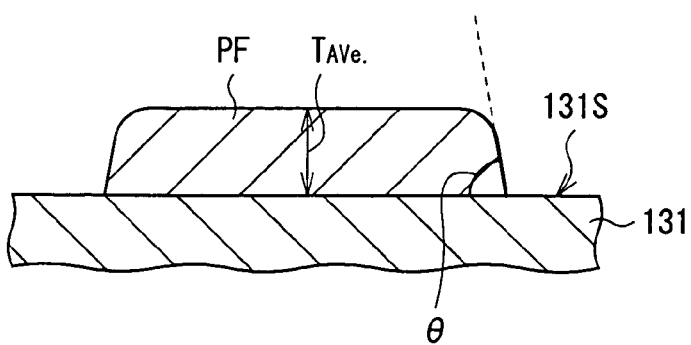

The lateral axis in FIG. 28A indicates average thickness Tave. (nm) of a film PF to be patterned, and the vertical axis indicates the inclination angle θ(deg.) of the end face of the film PF to be patterned. The inclination angle θ is, as shown in FIG. 28B, an angle formed by a supporting face 131S on which the film PF to be patterned is formed and the end face of the film PF to be patterned. When the inclination angle θ is 0°, it means that the end face is parallel with the supporting face 131S. When the inclination angle θ is 90°, it means that the end face is perpendicular to the supporting face 131S. "○" shows the characteristic value of a sample formed by the frame plating method, "▲" expresses the characteristic value of a sample formed by the milling method, and "●" denotes the characteristic value of a sample formed by reactive ion etching +(RIE). Samples with six kinds of thicknesses were prepared for each of the methods and the edge angles θ were measured. The sample formed by the frame plating method is a plating film pattern made of NiFe and having a desired thickness, and was formed as follows. An electrode film made of NiFe was formed by sputtering, a chemically amplified resist pattern for 248 nm was selectively formed on the electrode film, the resultant was soaked in a nickel Watt bath containing iron ions, and a plating process was performed, thereby forming a plated film pattern. Further, by using the plated film pattern as a mask, the electrode film was removed by milling. In this case, the thickness of the electrode film was about 30 nm. The chemically amplified resist pattern for 248 nm was formed so that the plated film has a thickness of +50 nm and a trench width of about 500 nm. The sample by the milling was formed as follows. An NiFe film having a predetermined thickness was formed by sputtering. A chemically amplified resist pattern for 248 nm having a thickness of 300 nm and a line width of 500 nm was selectively formed on the NiFe film. By using the resist pattern as a mask, the NiFe film was subjected to milling by using an argon gas in a direction perpendicular to the supporting face. The parameters of the milling were a gas pressure of $2.67 \times 10^{-2}$ Pa, beam current of 300 mA, and acceleration voltage of −500V. The sample by RIE was formed as follows. An NiFe film having a predetermined thickness was formed by sputtering. On the NiFe film, a titanium (Ti) film having a thickness of 50 nm and a width of 500 nm was selectively formed. Further, the titanium film was used as a mask and the NiFe film was etched by RIE, thereby forming the sample. The apparatus was of a capacitive-coupling parallel flat electrode type. As etching parameters, a gas obtained by mixing 50 mol % of $NH_3$ and 50 mol % of CO, in which a gas pressure is 0.75 Pa, frequency is 13.26 MHz, and high-frequency power density is $4 \times 10^4$ W/cm$^2$, was used.

As shown in FIG. 28A, the sample "○" formed by the frame plating method maintains large inclination angles θ of the same extent (almost 90°) through the range of the thickness Tave. from 100 nm to 500 nm. On the other hand, the sample "▲" formed by milling and the sample "●" formed by RIE have the inclination angles θ which decrease as the thickness Tave. increases, that is, the inclination of the end face is gentle. In particular, in the sample shown by "●" and formed by RIE, decrease in the inclination angle θ is conspicuous. At the thickness Tave. of 500 nm, the inclination angle θ is about 20°. From the results, it was found that by forming the film to be patterned made of NiFe by the frame plating method, the end face can be formed almost perpendicular to the supporting face. Therefore, by applying the method to the method of manufacturing the magnetic memory device, higher integration and higher packing density can be achieved.

Figure 29:
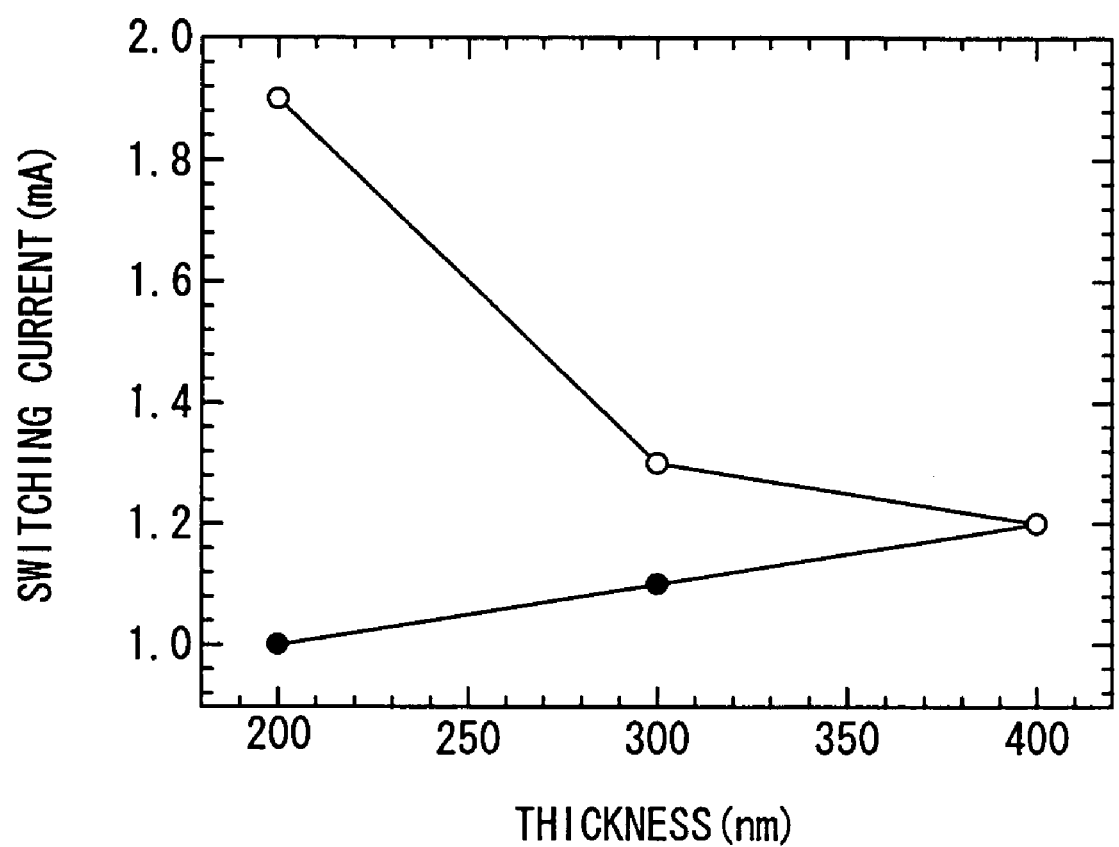
FIG. 29 is a characteristic diagram showing the relation between the thickness of a pillar yoke in the memory cell illustrated in FIG. 5 and switching current.

The relation between the pillar yoke having the sectional structure shown in FIG. 5A in the embodiment and the switching current in the magnetic memory cell was examined. FIG. 29 shows the result.

FIG. 29 shows the result of measuring the write current of a magnitude necessary to invert the magnetization direction in the magneto-sensitive layer (the connection part 14a and the second magnetic layer 8a) of the TMR element 1a and the magneto-sensitive layer (the connection part 14b and the second magnetic layer 8b) of the TMR element 1b shown in FIG. 5A, that is, the switching current. The lateral axis indicates the length in the Z direction of the pillar yoke 42, that is, the thickness (nm). The vertical axis indicates the switching current (mA) of a magnitude necessary to invert the magnetization direction. In FIG. 29, the plot shown by "○" indicates the switching current necessary to invert the magnetization of the magneto-sensitive layer of the TMR element 1a and the plot shown by "●" indicates the switching current necessary to invert the magnetization of the magneto-sensitive layer of the TMR element 1b. When the thickness is 400 nm, the switching current of 1.2 mA is passed in both of the cases. As the thickness decreases, the difference between the cases increases. In particular, when the thickness is 200 nm, the switching current in the magneto-sensitive layer in the TMR element 1b becomes 1.0 mA which is a smaller value. The switching current in the magneto-sensitive layer of the TMR element 1a is 1.9 mA which is almost twice as large as that of the TMR element 1b.

In the memory cell 1 shown in FIG. 5A, the magnetization direction of the magneto-sensitive layer in the TMR element 1a and that in the magneto-sensitive layer in the TMR element 1b are made opposite to each other, thereby recording information. Therefore, in a state where the magnetization of only one of the magneto-sensitive layers is inverted, information is not recorded. As shown in FIG. 29, when the thickness of the pillar yoke 42 is 200 nm, although by setting the switching current to 1.0 mA, the magnetization direction of the magneto-sensitive layer of the TMR element 1b is inverted, the magnetization direction of the magneto-sensitive layer of the TMR element 1a is not inverted. Therefore, information cannot be recorded. In this case, by setting the switching current to 1.9 mA or larger, both of the magnetization directions of the magneto-sensitive layers of the TMR elements 1a and 1b can be inverted. In the case where the thickness of the pillar yoke 42 is 300 nm, by setting the switching current to 1.3 mA or larger, both of the magnetization directions of the magneto-sensitive layers of the TMR elements 1a and 1b can be inverted. Further, when the thickness of the pillar yoke 42 is 400 nm, by setting the switching current to 1.2 mA or larger, both of the magnetization directions of the magneto-sensitive layers of the TMR elements 1a and 1b can be inverted. It is considered that by increasing the thickness of the pillar yoke 42, a uniform magnetic field of little deviation in the horizontal direction is formed more easily in the yoke 4.

As described above, we could have confirmed that the switching current depends on the thickness of the pillar yoke and, by increasing the thickness of the pillar yoke, the difference between the switching currents in the magneto-sensitive layers of the TMR elements 1a and 1b can be reduced and both of the magnetization directions of the TMR elements 1a and 1b can be inverted even by a lower switching current, so that it is efficient.

Although the invention has been described above in the embodiment and examples, the invention is not limited to the embodiment and examples but can be variously modified. Concretely, for example, in the embodiment, the case where each of the pair of magneto-resistive elements in the magnetic memory cell has an annular magnetic yoke and the pair of annular magnetic yokes are connected to each other has been described. The invention is not limited to the case. For example, like a memory cell 1A (first modification) shown in FIG. 30, two magnetic yokes each having a U shape of which opening part is positioned opposite to that of the stacked body (magnetic yokes each having a sectional shape a part of which is open) may be coupled to each other.

Figure 30:
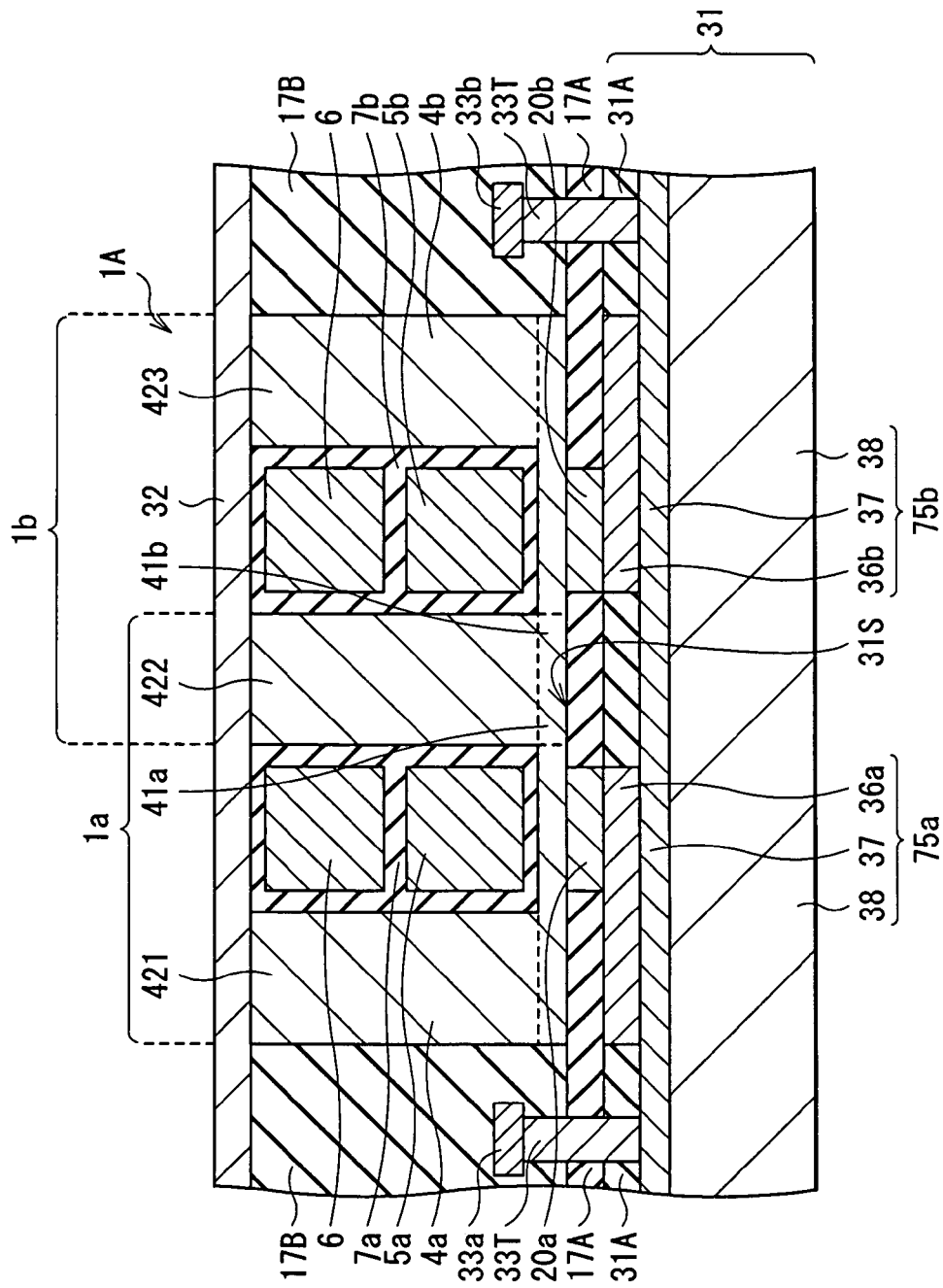
FIG. 30 is a cross section showing a first modification of the memory cell illustrated in FIG. 7.

Concretely, the memory cell 1A shown in FIG. 30 has: the TMR element 1a including the bottom yoke 41a and the pair of pillar yokes 421 and 422 coupled to both ends of the bottom yoke 41a and extending in the direction orthogonal to the supporting face 31S; and the TMR element 1b including the bottom yoke 41b and the pair of pillar yokes 422 and 423 coupled to both ends of the bottom yoke 41b and extending in the direction orthogonal to the supporting face 31S. The pair of TMR elements 1a and 1b share at least the pillar yoke 422. Also in such a configuration, by forming at least a part of the magnetic yoke by the plating method, high dimensional precision and sufficient thickness can be assured. Also in the case of applying the method to the magnetic memory device, higher integration and higher packing density can be achieved.

Figure 31:
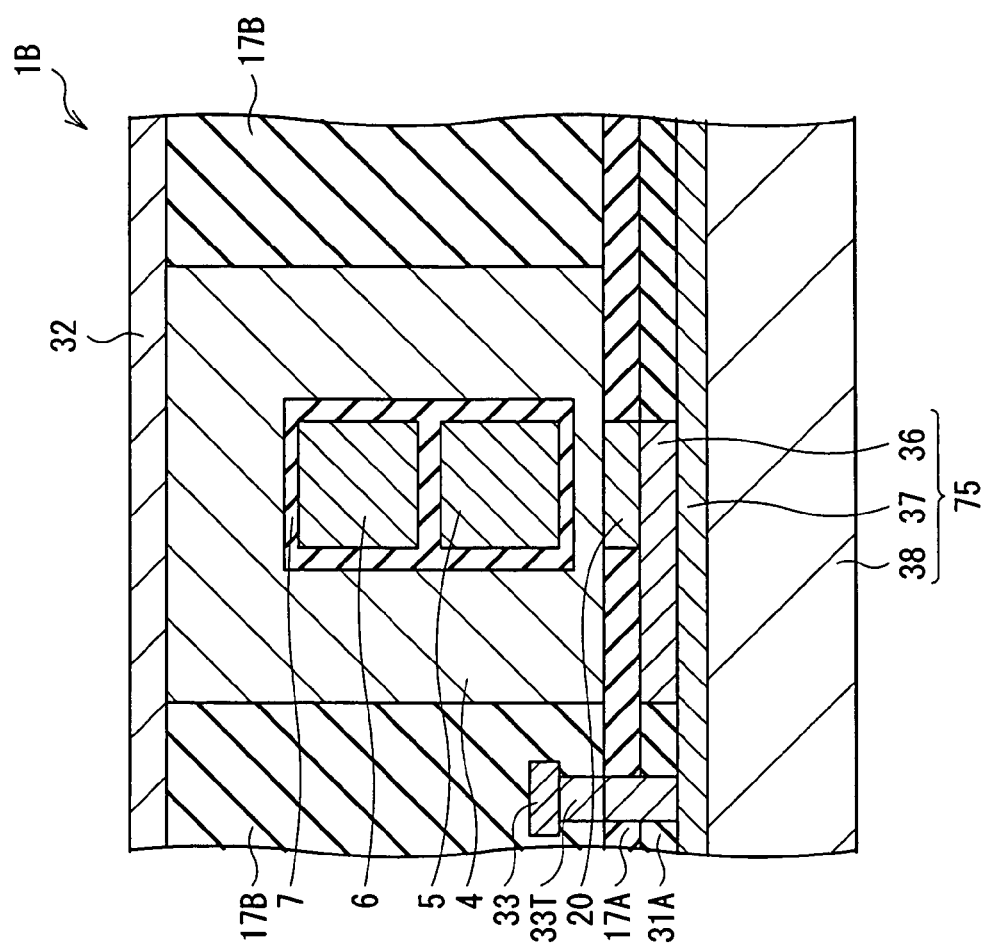
FIG. 31 is a cross section showing a second modification of the memory cell illustrated in FIG. 7.
Figure 32:
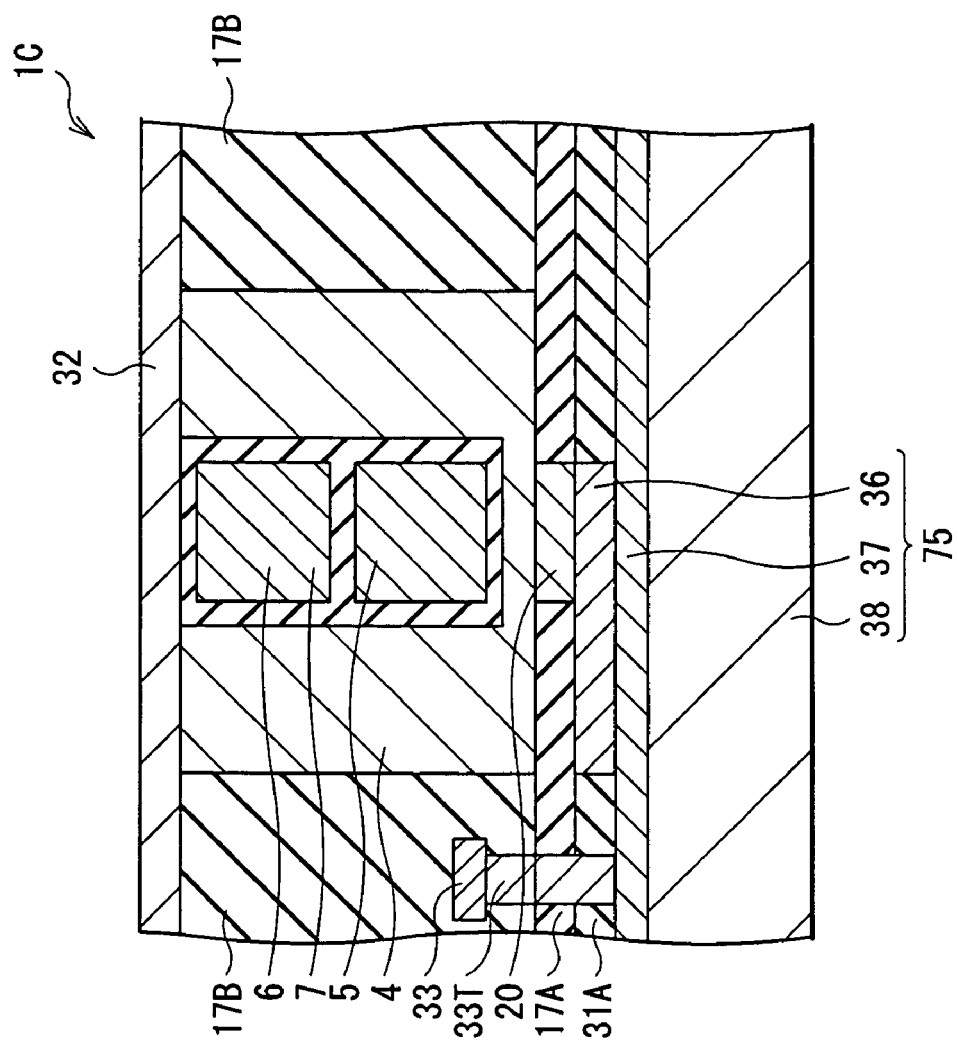
FIG. 32 is a cross section showing a third modification of the memory cell illustrated in FIG. 7.
Figure 33:
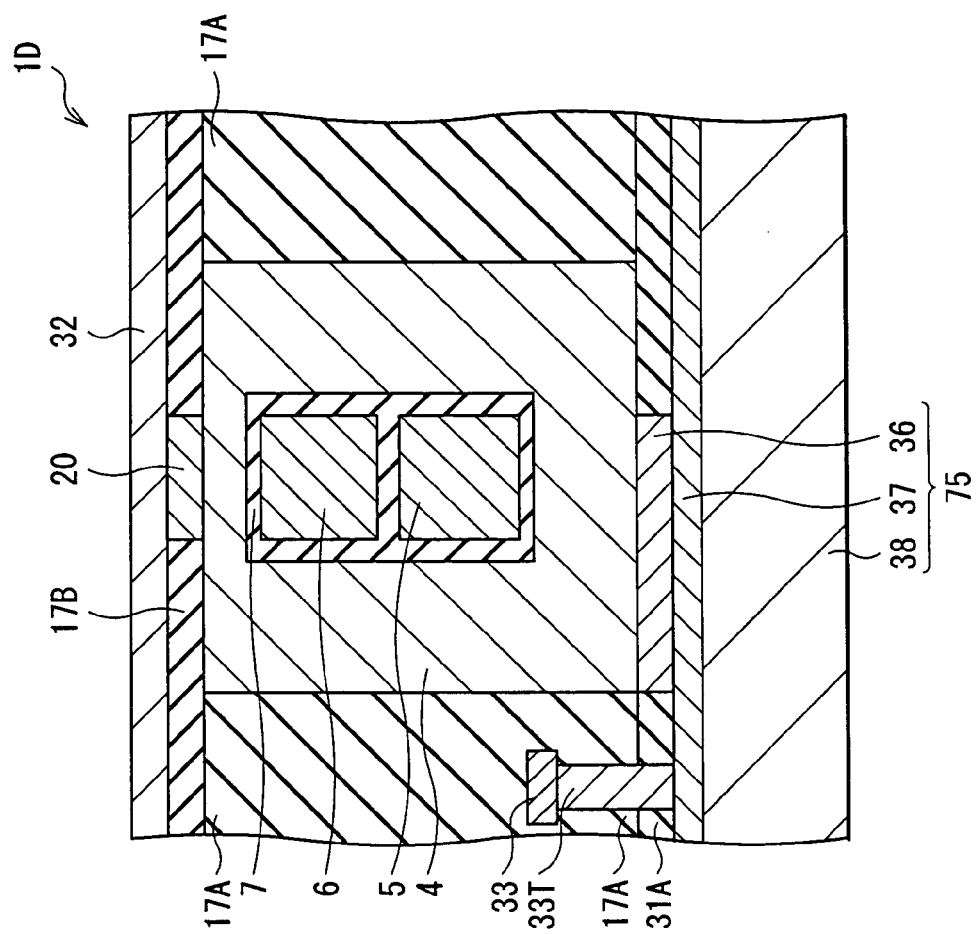
FIG. 33 is a cross section showing a fourth modification of the memory cell illustrated in FIG. 7.
Figure 34:
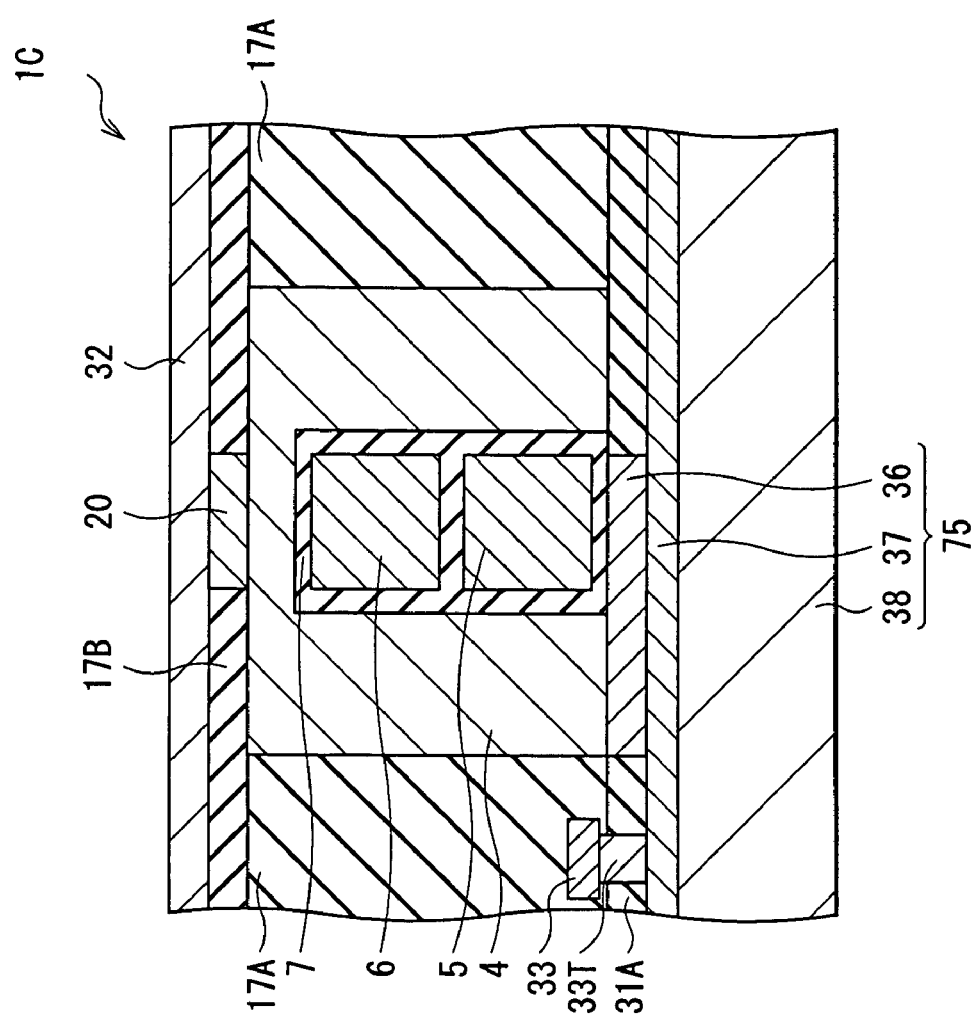
FIG. 34 is a cross section showing a fifth modification of the memory cell illustrated in FIG. 7.

Although the magnetic memory cell having a pair of magneto-resistive elements has been described in the foregoing embodiment, the invention is not limited to the magnetic memory cell. For example, like a memory cell 1B (second modification) shown in FIG. 31, a single TMR element having one magnetic yoke 4 and one stacked part 20 may be used as a magnetic memory element. Also in the memory cell 1B having such a configuration, by forming at least a part of the magnetic yoke 4 by the plating method, high dimensional precision and sufficient thickness can be assured. Also in the memory cell formed by a single TMR element, like a memory cell 1C (third modification) shown in FIG. 32, not an annular yoke but a magnetic yoke having a U shape in cross section and a part of which is open may be provided. In particular, in the case of a memory cell made by a single TMR element, like a memory cell 1D (fourth modification) shown in FIG. 33, the stacked part 20 can be provided on the side opposite to the substrate 31 over the magnetic yoke 4. In this case as well, like a memory cell 1E (fifth modification) shown in FIG. 34, the magnetic yoke 4 a part of which is open in cross section can be obtained.

Figure 35:
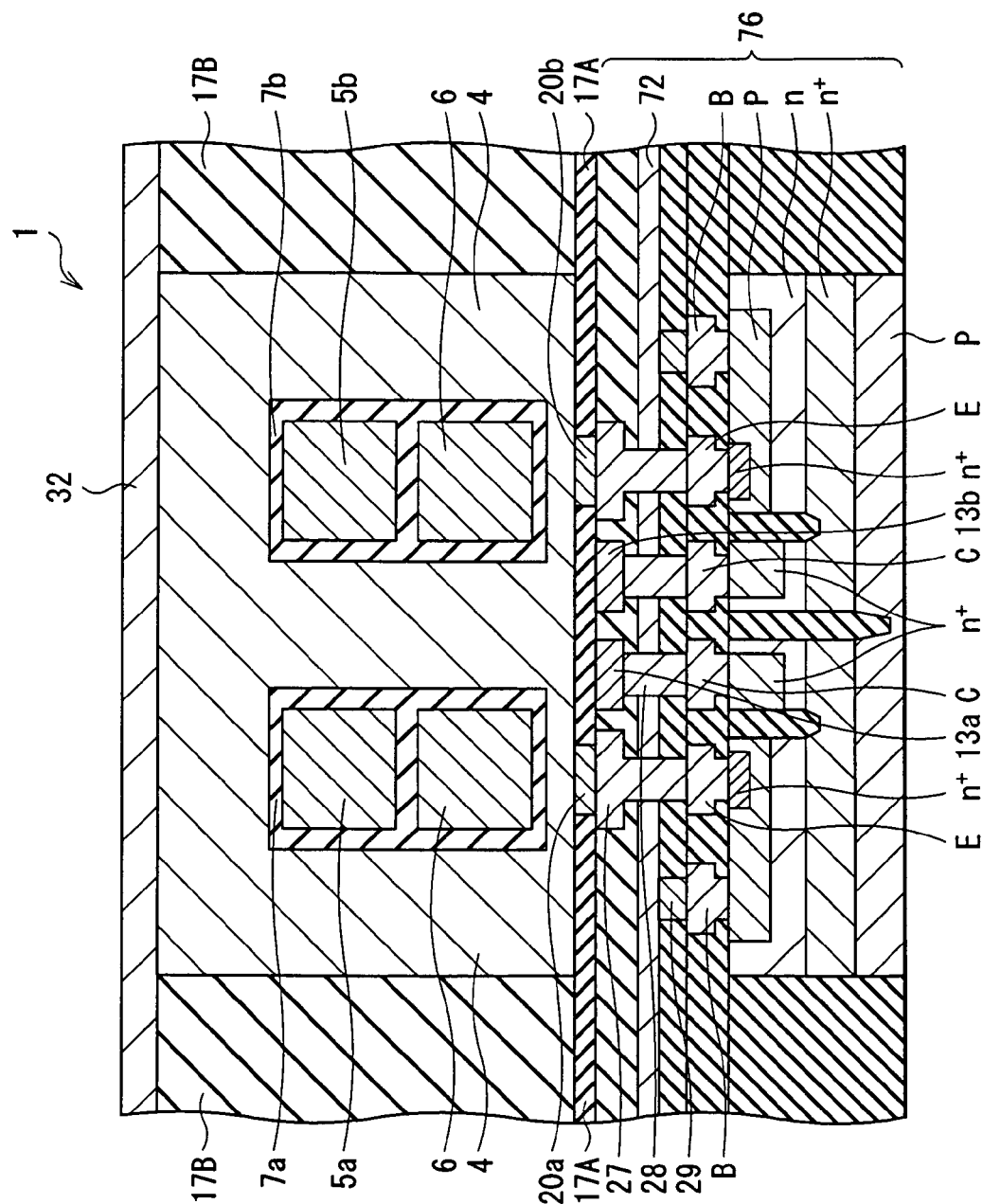
FIG. 35 is a circuit diagram showing another circuit configuration of the magnetic memory device illustrated in FIG. 1.
Figure 36:
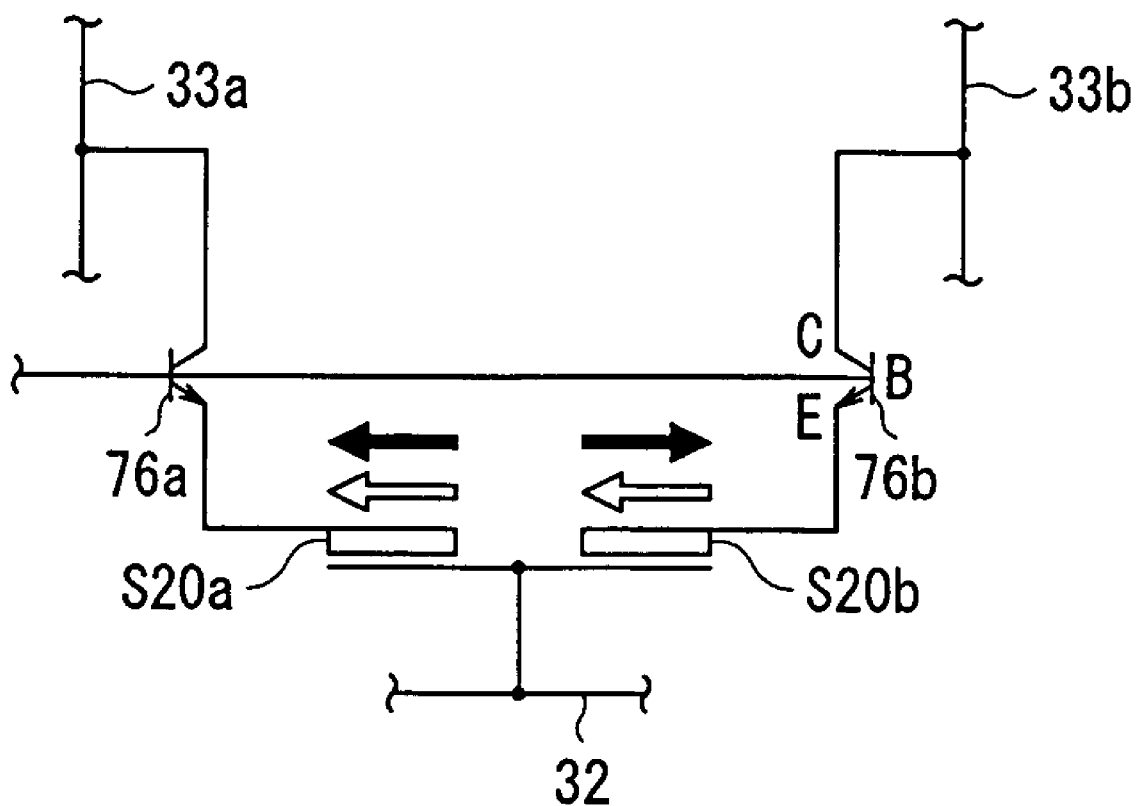
FIG. 36 is a partial enlarged view of the circuit configuration shown in FIG. 35.

Further, in the foregoing embodiment, a pair of diodes is used as a rectifier in the read circuit. The invention is not limited to the configuration. For example, as shown in FIGS. 35 and 36, a pair of bipolar transistors 76 may be used. In this case, one ends of the TMR elements 1a and 1b in each memory cell 1 are connected to the read bit lines 33a and 33b via a pair of bipolar transistors 76a and 76b and the other ends are connected to the common read word line 32. More specifically, a base B in the pair of bipolar transistors 76a and 76Bb is connected to the word decode line 72, a collector C is connected to the read bit lines 33a and 33b via the connection layer 29, and an emitter E is connected to the stacked portions 20a and 20b via the connection layer 27. In this case, when a control signal from the word decode line 72 reaches the bases B in the selected pair of bipolar transistors 76a and 76b, the collector C and the emitter E are made conductive, and read current flows in the stacked bodies S20a and S20b (stacked parts 20a and 20b), thereby reading information.

As described above, in the magneto-resistive element, magnetic memory cell, the magnetic memory devices of the first and second aspects, the method of manufacturing the magneto-resistive element, the method of manufacturing the magnetic memory cell, and the method of manufacturing the magnetic memory device of the second aspect, since the plating film is used for at least a part of the magnetic yoke. Therefore, as compared with the case where they are formed by a dry film forming method, sufficient thickness and higher dimensional precision can be obtained. Consequently, a more stabled return magnetic field can be generated efficiently, and high reliability can be assured. In particular, in the magnetic memory device of the invention, the intervals between neighboring magneto-resistive elements or magnetic memory cells can be further narrowed. Thus, the invention is suitable for realizing higher integration and higher packing density.

Obviously many modifications and variations of the present invention are possible in the light of the above teachings. It is therefore to be understood that within the scope of the appended claims, the invention may be practiced otherwise than as specifically described.

What is claimed is:

1. A magnetic memory device comprising:
   a first write line;
   a second write line extending so as to cross the first write line; and
   a pair of magneto-resistive elements,
   the pair of magneto-resistive elements each including:
      a magnetic yoke disposed in correspondence with a region in which the first and second write lines cross each other and constructed so as to surround partially or entirely the periphery of the first and second write lines; and
      a stacked body including a magneto-sensitive layer of which magnetization direction changes according to an external magnetic field, magnetically coupled to the magnetic yoke, and constructed so that current flows in a direction perpendicular to a stacked face,
   wherein the pair of magneto-resistive elements share only a part of the magnetic yoke, and at least a part of the magnetic yoke is constructed by a plating film.

2. A magnetic memory device according to claim 1, wherein the magnetic yoke includes:
   a pair of pillar yokes extending in a growth direction of the plating film while facing each other; and
   a beam yoke connecting with each one end of the pair of pillar yokes, the magnetic yoke has a sectional shape a part of which is open, and
   the pair of magneto-resistive elements share at least one of the pair of pillar yokes.

3. A magnetic memory device according to claim 1, wherein the magnetic yoke includes:
   a pair of pillar yokes extending in a growth direction of the plating film while facing each other; and
   a pair of beam yokes connecting with both ends of the pair of pillar yokes, the magnetic yoke has a closed sectional shape, and
   the pair of magneto-resistive elements share at least one of the pair of pillar yokes.

4. A magnetic memory device according to claim 1, wherein the first and second conductors are also made by a plating film.

5. The magnetic memory device according to claim 1, wherein each of the stacked bodies in the pair of magneto-resistive elements is formed at the same level.

6. A method of manufacturing a magnetic memory device comprising:
   a first write line;
   a second write line extending so as to cross the first write line; and
   a pair of magneto-resistive elements each including a magnetic yoke and a stacked body, comprising:
      a step of forming a pair of the magnetic yokes disposed in correspondence with a region in which the first and second write lines cross each other, surrounding partially or entirely the periphery of the first and second write lines, and only partially sharing each other; and a step of forming a pair of the stacked bodies including a magneto-sensitive layer of which magnetization direction changes according to an external magnetic field, magnetically coupled to the pair of magnetic yokes, and constructed so that current flows in a direction perpendicular to a stacked face, wherein in the step of forming the pair of magnetic yokes, at least a part of the pair of magnetic yokes is formed by plating.

7. The method of manufacturing a magnetic memory device according to claim 6, wherein the step of forming the pair of the stacked bodies is performed collectively at the same level.

* * * * *